*(12)* United States Patent
Ogihara et al.

(10) Patent No.: US 8,029,974 B2
(45) Date of Patent: *Oct. 4, 2011

(54) METAL OXIDE-CONTAINING FILM-FORMING COMPOSITION, METAL OXIDE-CONTAINING FILM-FORMED SUBSTRATE, AND PATTERNING PROCESS

(75) Inventors: Tsutomu Ogihara, Jyoetsu (JP); Takafumi Ueda, Jyoetsu (JP); Toshiharu Yano, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 32 days.

This patent is subject to a terminal disclaimer.

(21) Appl. No.: 12/461,726

(22) Filed: Aug. 21, 2009

(65) Prior Publication Data

US 2010/0086872 A1   Apr. 8, 2010

(30) Foreign Application Priority Data

Oct. 2, 2008  (JP) ................................. 2008-257207

(51) Int. Cl.
*G03F 7/00* (2006.01)
*G03F 7/004* (2006.01)
*G03F 7/26* (2006.01)
*G03F 7/075* (2006.01)
*G03F 7/40* (2006.01)

(52) U.S. Cl. .................. 430/270.1; 430/272.1; 430/311; 430/313; 430/317; 430/322; 430/326; 430/331; 430/323; 430/325

(58) Field of Classification Search ............... 430/270.1, 430/272.1, 311, 313, 317, 322, 323, 325, 430/326, 331

See application file for complete search history.

(56) References Cited

U.S. PATENT DOCUMENTS

| | | | |
|---|---|---|---|
| 5,385,804 A | 1/1995 | Premlatha et al. | |
| 5,632,910 A | 5/1997 | Nagayama et al. | |
| 6,013,416 A | 1/2000 | Nozaki et al. | |
| 6,025,117 A | 2/2000 | Nakano et al. | |
| 6,280,898 B1 | 8/2001 | Hasegawa et al. | |
| 6,329,125 B2 | 12/2001 | Takechi et al. | |
| 6,503,692 B2 | 1/2003 | Angelopoulos et al. | |
| 6,703,183 B2 | 3/2004 | Nishi et al. | |
| 7,303,785 B2 | 12/2007 | Ogihara et al. | |
| 7,303,855 B2 | 12/2007 | Hatakeyama et al. | |
| 7,432,035 B2 | 10/2008 | Maeda et al. | |
| 7,875,417 B2 | 1/2011 | Ogihara et al. | |
| 2001/0026901 A1 | 10/2001 | Maeda et al. | |
| 2002/0187422 A1 | 12/2002 | Angelopoulos et al. | |
| 2003/0091929 A1 | 5/2003 | Nishi et al. | |
| 2004/0247900 A1 | 12/2004 | Ogihara et al. | |
| 2004/0253461 A1 | 12/2004 | Ogihara et al. | |
| 2005/0106499 A1 | 5/2005 | Harada et al. | |
| 2006/0019195 A1 | 1/2006 | Hatakeyama et al. | |
| 2007/0134916 A1* | 6/2007 | Iwabuchi et al. ............. 438/636 |
| 2008/0026322 A1* | 1/2008 | Ogihara et al. ............ 430/270.1 |
| 2009/0011372 A1 | 1/2009 | Ogihara et al. | |
| 2009/0136869 A1* | 5/2009 | Ogihara et al. ............ 430/270.1 |
| 2010/0086870 A1 | 4/2010 | Ogihara et al. | |

FOREIGN PATENT DOCUMENTS

| | | |
|---|---|---|
| EP | 1 375 615 A2 | 1/2004 |
| EP | 1 788 012 A1 | 5/2007 |
| EP | 1 788 433 A2 | 5/2007 |
| EP | 1 845 132 A2 | 10/2007 |
| EP | 1 867 681 A1 | 12/2007 |
| EP | 2 011 829 A1 | 1/2009 |
| EP | 2 063 319 A1 | 5/2009 |
| JP | A-5-291208 | 11/1993 |
| JP | A-6-95385 | 4/1994 |
| JP | A-7-181688 | 7/1995 |
| JP | A-7-183194 | 7/1995 |
| JP | A-8-12626 | 1/1996 |
| JP | A-9-73173 | 3/1997 |
| JP | A-11-60735 | 3/1999 |
| JP | A-2000-159758 | 6/2000 |
| JP | A-2003-84438 | 3/2003 |
| JP | A-2004-153125 | 5/2004 |
| JP | A-2004-157469 | 6/2004 |
| JP | A-2004-191386 | 7/2004 |
| JP | A-2004-349572 | 12/2004 |
| JP | A-2005-15779 | 1/2005 |

(Continued)

OTHER PUBLICATIONS

European Search Report for Application No. 09012329.0, issued Jan. 28, 2010.

Sugita et al.; "Spin-on-Glass (SOG) for the Trilayer Imaging Process;" *Journal of Applied Polymer Science*; 2003; pp. 636-640; vol. 88.

Brinker et al.; "Sol-Gel Science: The Physics and Chemistry of Sol-Gel Processing;" *Academic Press*; 1990; p. 120.

Oct. 7, 2010 Notice of Allowance issued in U.S. Appl. No. 12/163,350.

(Continued)

*Primary Examiner* — Amanda C. Walke
(74) *Attorney, Agent, or Firm* — Oliff & Berridge, PLC

(57) ABSTRACT

There is disclosed a thermosetting metal oxide-containing film-forming composition for forming a metal oxide-containing film to be formed in a multilayer resist process used in lithography, the thermosetting metal oxide-containing film-forming composition comprising, at least: (A) a metal oxide-containing compound obtained by hydrolytic condensation of a hydrolyzable silicon compound and a hydrolyzable metal compound; (B) a thermal crosslinking accelerator; (C) a monovalent, divalent, or higher organic acid having 1 to 30 carbon atoms; (D) a trivalent or higher alcohol; and (E) an organic solvent. There can be provided a metal oxide-containing film-forming composition in a multi-layer resist process, in a manner that a film made of the composition allows for formation of an excellent pattern of a photoresist film, the composition is capable of forming a metal oxide-containing film as an etching mask having an excellent dry etching resistance, the composition is excellent in storage stability, and the film made of the composition is removable by a solution used in a removal process; a metal oxide-containing film-formed substrate; and a pattern forming process.

27 Claims, No Drawings

FOREIGN PATENT DOCUMENTS

| | | |
|---|---|---|
| JP | A-2005-128509 | 5/2005 |
| JP | A-2005-146252 | 6/2005 |
| JP | A-2005-520354 | 7/2005 |
| JP | A-2007-163846 | 6/2007 |
| JP | A-2008-19423 | 1/2008 |
| WO | WO 00/01684 | 1/2000 |
| WO | WO 2006/040956 A1 | 4/2006 |

OTHER PUBLICATIONS

Apr. 28, 2010 Office Action issued in Japanese Patent Application No. 2007-245870.

Ito et al., "Synthesis and Preliminary Evaluation of Substituted Poly(Norbornene Sulfones) for 193 NM Lithography," Polm. Mater. Sci. Eng., vol. 77, 1997, pp. 449-450.

Dec. 28, 2010 Office Action issued in U.S. Application No. 12/275,088.

Apr. 28, 2010 Office Action issued in Japanese Patent Application No. 2007-303130.

Mar. 22, 2011 Notice of Allowance issued in U.S. Appl. No. 12/163,795.

Oct. 1, 2010 Office Action issued in U.S. Appl. No. 12/163,795.

Jan. 29, 2010 Search Report issued in European Patent Application No. 09012327.4.

* cited by examiner

METAL OXIDE-CONTAINING FILM-FORMING COMPOSITION, METAL OXIDE-CONTAINING FILM-FORMED SUBSTRATE, AND PATTERNING PROCESS

BACKGROUND OF THE INVENTION

1. Field of the Invention

The present invention relates to a metal oxide-containing film-forming composition for forming a metal oxide-containing film to be used in a multi-layer resist process used for fine processing in a manufacturing process of semiconductor devices and the like; a metal oxide-containing film-formed substrate; and a patterning process using the composition.

2. Description of the Related Art

With highly integrated LSI's providing highly increased speeds, finer pattern rules are being rapidly promoted. Commensurately with the fineness, the lithography technique has attained formation of fine patterns, by virtue of light sources of shorter wavelengths and resist compositions appropriately selected therefor. The main role thereof was played by positive photoresist compositions to be each used as a monolayer. The monolayer positive photoresist composition is configured to possess, in a resist resin, a frame having an etching resistance against dry etching by chlorine-based or fluorine-based gas plasma, and to possess such a resist mechanism that an exposed portion is made dissolvable, so that the exposed portion is dissolved to thereby form a pattern, and the remaining resist pattern is used as an etching mask to dry etch a processing substrate coated with the resist composition.

However, when a pattern is made finer, i.e., pattern rules are further narrowed while keeping a thickness of a used photoresist film as it is, the photoresist film is deteriorated in resolution performance. Further, when the resist film is to be developed by a developer to form a pattern, a so-called aspect ratio thereof is made excessively large, thereby resultingly causing a pattern collapse. Thus, the fineness has been accompanied by decrease in photoresist film thickness.

Meanwhile, although for processing of a processing substrate, there is typically used a method for processing the processing substrate by dry etching by adopting a patterned photoresist film as an etching mask, practically no dry etching methods exist to exhibit a complete etching selectivity between a photoresist film and a processing substrate, so that the resist film is also damaged during processing of the processing substrate and the resist film is collapsed, thereby failing to accurately transfer a resist pattern onto the processing substrate. Thus, with finer patterns, resist compositions have been required to have higher dry etching resistances.

Further, since shortened wavelengths of exposure have demanded that resins having lower light absorption at exposure wavelengths are used for resist compositions, such resins have been subjected to a transitional history from a novolak resin, through polyhydroxystyrene, and to a resin having an aliphatic polycyclic frame, commensurately with a transitional history from i-beam, through KrF, and to ArF. However, etching speeds under the dry etching condition have been practically made higher, so that recent photoresist compositions having higher resolutions practically tend to be rather lowered in etching resistance.

This obliges a processing substrate to be dry etched by a photoresist film which is inevitably thinner and weaker in etching resistance, thereby making it urgent to ensure a material and a process in this processing state.

As one method to solve such a problem, multi-layer resist process have been used. The methods are configured to: interpose a resist intermediate film having an etching selectivity different from that of a photoresist film, i.e., a resist upper layer film, between the resist upper layer film and a processing substrate; obtain a pattern in the resist upper layer film; thereafter transfer the pattern to the resist intermediate film by dry etching by using the obtained resist upper layer film pattern as a dry etching mask; and further transfer the pattern onto the processing substrate by dry etching by using the obtained pattern of the intermediate film as a dry etching mask.

In a bilayer resist process as one of the multi-layer resist processes, a silicon-containing resin is used as a resist composition of a upper layer film, and a novolak resin is used as an intermediate film (Japanese Patent Laid-Open (kokai) No. H6-95385, for example). The silicon resin exhibits an excellent etching resistance against reactive dry etching by oxygen plasma, but is easily etched and removed by using fluorine-based gas plasma. In turn, the novolak resin is easily etched and removed by reactive dry etching by oxygen gas plasma, but exhibits an excellent etching resistance against dry etching by fluorine-based gas plasma, chlorine-based gas plasma, or the like. Thus, a novolak resin film as a resist intermediate film is formed on a processing substrate, and a resist upper layer film adopting a silicon-containing resin is formed thereon. Next, the silicon-containing resist film is subjected to pattern formation by a post treatment such as irradiation of energy beam, development, and the like, and the formed pattern is used as a dry etching mask in a manner to remove a novolak resin by reactive dry etching based on oxygen plasma at those portions of the novolak resin where the resist pattern material has been developedly removed, to thereby transfer the pattern to the novolak film. Further, the pattern transferred to the novolak film is used as a dry etching mask, thereby enabling pattern transference to the processing substrate by etching based on fluorine-based gas plasma, chlorine-based gas plasma, or the like.

Since such a pattern transference based on dry etching leads to obtainment of a transferred pattern in a relatively excellent profile when an etching resistance of the etching mask is sufficient, problems are scarcely caused such as pattern collapse due to friction or the like by a developer upon development of a resist, thereby allowing for obtainment of a pattern having a relatively large aspect ratio. Thus, even for a fine pattern which has not been directly formed due to pattern collapse upon development or the like due to a problem of aspect ratio when a resist film exemplarily adopting a novolak resin has been made to have a thickness corresponding to that of the aforementioned intermediate film, the above-described bilayer resist process allows for obtainment of such a novolak resin pattern having a sufficient thickness as a dry etching mask of a processing substrate.

The multi-layer resist process further include a three-layer resist process which can be performed by using a typical resist composition used in a monolayered resist process. For example, this method is configured to form: an organic film as a resist lower layer film based on novolak or the like on a processing substrate; a silicon-containing film as a resist intermediate film, thereon; and a typical organic photoresist film as a resist upper layer film, thereon. Since the organic resist upper layer film exhibits an excellent etching selectivity ratio relative to the silicon-containing resist intermediate film for dry etching by fluorine-based gas plasma, the resist pattern is transferred to the silicon-containing resist intermediate film by means of dry etching based on fluorine-based gas plasma. According to this method, patterns of novolak films having sufficient dry etching resistances for processing can be obtained similarly to the bilayer resist process insofar as patterns can be transferred to silicon-containing films, even by adopting: a resist composition which is difficult to be formed with a pattern having a sufficient film thickness for direct processing of a processing substrate; and a resist composition having an insufficient dry etching resistance for processing of a substrate.

Examples of silicon-containing resist intermediate films to be used in the above-described three-layer resist process include silicon-containing inorganic films by CVD, such as $SiO_2$ films (Japanese Patent Laid-Open (kokai) No. H7-183194, for example) and SiON films (Japanese Patent Laid-Open (kokai) No. H7-181688, for example); and films obtained by spin coating, such as SOG (spin-on-glass) films (Japanese Patent Laid-Open (kokai) No. H5-291208, J. Appl. Polym. Sci., Vol. 88, 636-640 (2003), for example), and crosslinkable silsesquioxane films (Japanese translation of PCT international application No. 2005-520354, for example); and polysilane films (Japanese Patent Laid-Open (kokai) No. H11-60735, for example) would also be usable. Although the $SiO_2$ films and SiON films have excellent performances as a dry etching mask upon dry etching of an underlying organic film, a specific equipment is required for film-formation. Contrary, the SOG films, crosslinkable silsesquioxane films, and polysilane films can be formed by only spin coating and heating, and are thus considered to be high in process efficiency.

The applicability of the multi-layer resist process is not restricted to an attempt to enhance a resolution limit of resist film. In a via-first method which is one of substrate processing methods where a processing intermediate substrate has large height differences, an attempt to form a pattern with a single resist film encounters a problem such as inaccurate focusing during resist exposure due to a substantial difference in resist film thickness. In such a case, the height differences are filled by a sacrificial film and flattened thereby, then a resist film is formed thereon and a resist pattern is formed, and this situation inevitably entails usage of the aforementioned multi-layer resist process (Japanese Patent Laid-Open (kokai) No. 2004-349572, for example).

Silicon-containing films having been conventionally used in such a multi-layer resist process have several problems. For example, it is well known that when a resist pattern is intended be formed by photolithography, exposure light is reflected by a substrate and interferes with incident light, to cause a problem of so-called standing waves, and it is required to interposingly provide an antireflective film as an intermediate film so as to obtain a fine pattern which is free of edge roughness of photoresist film. Particularly, reflection control is indispensable, under the most-advanced high NA exposure conditions.

Then, it becomes necessary to interpose an organic antireflective film between a silicon-containing film and a photoresist film to be formed on the silicon-containing film, in a process for forming the silicon-containing film as a resist intermediate film, particularly by CVD in a multi-layer resist process. However, when such an organic antireflective film is to be additionally interposed, it becomes necessary to pattern the organic antireflective film by using the photoresist film as a dry etching mask, such that transference to processing of the silicon-containing film is allowed after dry etching of the organic antireflective film by using the photoresist film as the mask upon dry etching. As such, the overlying photoresist film is subjected to an additional burden of dry etching to an extent the processing of the organic antireflective film. Particularly, most-advanced photoresist films have been made small in thickness, so that such dry etching burden is not negligible. Thus, attention has been directed to a three-layer resist process utilizing a light-absorbing silicon-containing film as a resist intermediate film which is free of occurrence of the aforementioned etching burden.

Known as such a light-absorbing silicon-containing film to be utilized as a resist intermediate film, is a spin coating type of light-absorbing silicon-containing film. Exemplarily disclosed is a technique for causing the film to have an aromatic structure as a light-absorbing structure (Japanese Patent Laid-Open (kokai) No. 2005-15779).

However, since the aromatic ring structure for effective light absorption has a function to lower a dry etching speed in case of dry etching by fluorine-based gas plasma, this is a disadvantageous way to conduct dry etching of a resist intermediate film without burdening a photoresist film. Then, since addition of a large amount of such light-absorbing substitutional groups is undesirable, it is required to restrict the addition amount to a minimum.

Further, the dry etching speed for reactive dry etching by typically used oxygen gas plasma upon processing of a resist lower layer film while using a resist intermediate film as a dry etching mask, is to be preferably low so as to increase an etching selectivity ratio between the resist intermediate film and the resist lower layer film, so that such a resist intermediate film is desired which has a possibly higher silicon content exhibiting a higher reactivity with a fluorine-based etching gas so as to obtain such a dry etching characteristic. As noted above, those films are preferable having higher contents of silicon which is a component having a higher reactivity with a fluorine gas, in view of the requirement from the processing conditions of both the overlying photoresist film and the underlying organic film.

Actual silicon-containing intermediate film-forming compositions of spin coating type contain organic substitutional groups so that a silicon-containing compound is made dissolvable in an organic solvent. There is disclosed a composition for forming a SOG film among known silicon-containing films as resist intermediate films in lithography using KrF excimer laser light in the J. Appl. Polym. Sci., Vol. 88, 636-640 (2003).

However, since no descriptions are found concerning a light-absorbing group for the disclosed composition, it is supposed that a silicon-containing film to be obtained from the composition fails to have an antireflective function.

This fails to prevent reflection upon exposure in lithography using a most-advanced high-NA exposure system, thereby possibly failing to obtain a finer resist pattern profile.

Moreover, since photoresist films have been further decreased in thickness in a most-advanced semiconductor process using the above-described high-NA exposure system, it is predicted that a pattern transference to a silicon-containing intermediate film is made difficult in case of etching the intermediate film by using a photoresist film as an etching mask, when a silicon content of the silicon-containing intermediate film is merely increased while possessing an antireflective function. As such, materials having faster etching speeds are expected.

As described above, resist intermediate films to be used in multi-layer resist process are required to realize: excellent dry etching characteristics relative to resist upper layer films and resist lower layer films; and highly fine resist pattern profile.

Particular concern in a composition for forming a resist intermediate film having a higher silicon content rate, is a storage stability of the composition. Silanol groups present in silicon-containing compounds included in the compositions sometimes condense, so that molecular weights of silicon-containing film-forming compositions are changed.

Typically, when a hydrolyzable silicon compound is affected by water in the presence of an acid catalyst, a hydrolyzable substitutional group(s) is/are subjected to hydrolysis, to form a silanol group(s). The silanol group is further subjected to a condensation reaction with another silanol group or an unreacted hydrolyzable group, to form a siloxane bond. This reaction is successively and repetitively caused, to resultingly form a silicon-containing compound, so-called an oligomer, polymer, or a sol as the case may be. At this time, the condensation reaction is progressed sequentially from the silanol group having the highest reactivity among those silanol groups derived from monomers, oligomers, polymers, and the like produced by hydrolysis reaction in the system, in a manner to consume silanol groups belonging to the monomers, oligomers, polymers, and the like, thereby forming a silicon-containing compound. Moreover, such a condensation reaction occasionally progresses endlessly, to an extent that the silicon-containing compound solution is eventually gelated. In such a condition, film thickness fluctuation, lithography performance fluctuation, and the like are observed. Since fluctuation of lithography performance is particularly delicate, such a fluctuation is inevitably observed as a change of finer pattern profile even when condensation of silanol groups in molecules is not observable as a film thickness increase or a molecular weight change.

It has been conventionally described that such a highly reactivity silanol group can be relatively stabilized when the same is preserved in an acidic state, in a C. J. Brinker and G. W. Scherer, "Sol-Gel Science: The Physics and Chemistry of Sol-Gel Processing", Academic Press, San Diego, p. 120 (1990) and the like.

Further, there has been disclosed addition of water so as to improve a storage stability, in the J. Appl. Polym. Sci., Vol. 88, 636-640 (2003), Japanese Patent Laid-Open (kokai) No. 2004-157469, Japanese Patent Laid-Open (kokai) No. 2004-191386, and the like.

However, even when such countermeasures are taken for silicon-containing compounds in silicon-containing film-forming compositions produced in the above methods, it is actually impossible to completely stop condensation reactions of silanol groups, so that the silicon-containing compounds slowly change over time, and natures of silicon-containing films to be obtained from the thus changed silicon-containing film-forming compositions are also changed. As such, it has been necessary to preserve them by refrigerating or freezing until just before usage thereof, and to bring them back to a service temperature (typically 23° C.) upon usage in a manner to swiftly use them up.

Meanwhile, in an actual manufacturing process of a semiconductor device, defects are occasionally caused in coated films formed on the substrate, and re-processing is thus to be performed. Conventional SOG films have compositions substantially equivalent to $SiO_2$. Thus, to remove the films, dry delamination or the like based on hydrofluoric acid or fluorine gas has been conducted, but such a removal technique has brought about a serious damage against the substrate.

Against such a problem, there has been sought for a silicon-containing film-forming composition which can be subjected to wet delamination for utilizing a sulfuric acid-hydrogen peroxide-water mixture or ammonia-hydrogen peroxide-water mixture typically used in a conventional semiconductor device production process.

SUMMARY OF THE INVENTION

The present invention has been carried out in view of the above circumstances, and it is therefore an object of the present invention to provide: a metal oxide-containing film-forming composition for forming a metal oxide-containing film, such that: (1) the film mad of the composition allows for formation of an excellent resist film pattern even under a high-NA exposure condition, when the photoresist film is formed as a resist upper layer film on the metal oxide-containing film formed on an organic film acting as a resist lower layer film, and the resist film pattern is subsequently formed; (2) the film made of the composition has an excellent dry etching characteristic relative to the photoresist film and the organic film; (3) the composition is excellent in storage stability; and (4) the film made of the composition is capable of being delaminated, not only by conventional hydrofluoric acid, dry delamination, and the like, but also by a solution used in a delamination process such as a sulfuric acid-hydrogen peroxide-water mixture, ammonia-hydrogen peroxide-water mixture, or the like; a substrate formed with a metal oxide-containing film formed from the metal oxide-containing film-forming composition; and a patterning process using the composition.

To achieve the above object, the present invention provides:

a thermosetting metal oxide-containing film-forming composition for forming a metal oxide-containing film to be formed in a multi-layer resist process used in lithography, the thermosetting metal oxide-containing film-forming composition comprising, at least:

(A) a metal oxide-containing compound obtained by hydrolytic condensation of: one kind or two or more kinds of hydrolyzable silicon compounds represented by the following general formula (1); and one kind or two or more kinds of hydrolyzable metal compounds represented by the following general formula (2):

$$R^1{}_{m1}R^2{}_{m2}R^3{}_{m3}Si(OR)_{(4-m1-m2-m3)} \quad (1)$$

wherein R is an alkyl group having 1 to 6 carbon atoms;
$R^1$, $R^2$, and $R^3$ are each a hydrogen atom or a monovalent organic group having 1 to 30 carbon atoms;
m1, m2, and m3 are 0 or 1; and
m1+m2+m3 is an integer from 0 to 3

$$U(OR^4)_{m4}(OR^5)_{m5} \quad (2)$$

wherein $R^4$ and $R^5$ are an organic group having 1 to 30 carbon atoms;
m4+m5 is a valence to be determined by a kind of U;
m4 and m5 are an integer of 0 or more; and
U is an element belonging to group III, group IV or group V in the periodic table, except for silicon and carbon (B) one kind or two or more kinds of thermal crosslinking accelerators represented by the following general formula (3) or (4):

$$L_aH_bX \quad (3)$$

wherein L is lithium, sodium, potassium, rubidium, or cesium;
X is a hydroxyl group, or a monovalent, divalent or higher organic acid group having 1 to 30 carbon atoms;
a is an integer of 1 or more;
b is an integer of 0 or 1 or more; and
a+b is a valence of the hydroxyl group or organic acid group $$M_a \cdot H_b \cdot A \quad (4)$$

wherein M is sulfonium, iodonium, or ammonium;
A is a hydroxyl group, a monovalent, divalent, or higher organic acid group having 1 to 30 carbon atoms, or a non-nucleophilic counter ion;
a' is an integer of 1 or more;
b' is an integer of 0 or 1 or more; and a'+b' is a valence of the hydroxyl group, organic acid group, or non-nucleophilic counter ion (C) a monovalent, divalent, or higher organic acid having 1 to 30 carbon atoms;

(D) a trivalent or higher alcohol; and (E) an organic solvent.

Adopting the thermosetting metal oxide-containing film-forming composition of the present invention in a multi-layer resist process to be used in lithography, enables to obtain:

(1) a metal oxide-containing film, which allows for formation of an excellent resist film pattern even under a high-NA exposure condition in both a dried state and a liquid immersion state;

(2) a metal oxide-containing film, which is capable of exhibiting, as a dry etching mask, sufficient etching selectivity ratios relative to an overlying photoresist film and an underlying organic film, respectively;

(3) a metal oxide-containing film-forming composition, which has an excellent storage stability, and is unchanged in lithography performance even by long-term storage; and (4) a metal oxide-containing film, which can be subjected to wet delamination for utilizing a sulfuric acid/hydrogen peroxide mixture or ammonia/hydrogen peroxide mixture typically used in a conventional semiconductor device production process.

Preferably, the thermosetting metal oxide-containing film-forming composition further comprises a silicon-containing compound obtained by hydrolytic condensation of one kind or two or more kinds of hydrolyzable silicon compounds represented by the following general formula (5):

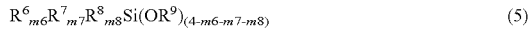

$$R^6{}_{m6}R^7{}_{m7}R^8{}_{m8}Si(OR^9)_{(4-m6-m7-m8)} \quad (5)$$

wherein $R^9$ is an alkyl group having 1 to 6 carbon atoms;

$R^6$, $R^7$, and $R^8$ are each a hydrogen atom, or a monovalent organic group having 1 to 30 carbon atoms;

m6, m7, and m8 are 0 or 1; and m6+m7+m8 is an integer from 0 to 3.

In the present invention, the thermosetting metal oxide-containing film-forming composition further comprises the silicon-containing compound obtained by hydrolytic condensation of the hydrolyzable silicon compound represented by the above general formula (5), so that the characteristic possessed by the metal oxide-containing compound can be combined with the characteristic possessed by the silicon-containing compound, thereby enabling obtainment of the metal oxide-containing film-forming composition having a characteristic superior to those of conventional organic antireflective films.

Further, it is preferable to comprise the metal oxide-containing film obtained by the hydrolytic condensation of the hydrolyzable silicon compound and the hydrolyzable metal compound, the hydrolytic condensation being conducted by the aid of acid as a catalyst.

In the present invention, the acid is used as a hydrolytic condensation catalyst, thereby enabling obtainment of a metal oxide-containing film-forming composition having an excellent storage stability and having lithographic characteristics at the same level as typical organic antireflective films.

Preferably, the catalyst is an acid catalyst which is one or more kinds of compounds selected from inorganic acids and sulfonic acid derivatives.

The present invention particularly adopts the inorganic acid or sulfonic acid derivative as the hydrolytic condensation catalyst, thereby more assuredly enabling obtainment of a metal oxide-containing film-forming composition having an excellent storage stability and having lithographic characteristics at the same level as typical organic antireflective films.

Further, it is preferable to comprise the metal oxide-containing compound obtainable through a step of substantially removing the acid catalyst from that reaction product mixture containing the metal oxide-containing compound, the reaction product mixture being obtained by the hydrolytic condensation of the hydrolyzable silicon compound and the hydrolyzable metal compound.

In this way, by exemplarily using one or more kinds of compounds selected from inorganic acids and sulfonic acid derivatives, as the acid catalyst, and by substantially removing the acid catalyst from that reaction product mixture obtained by the hydrolytic condensation of the hydrolyzable silicon compound and the hydrolyzable metal compound, the storage stability of the composition can be further improved.

Furthermore, U in the above general formula (2) is preferably boron, aluminum, gallium, yttrium, germanium, titanium, zirconium, hafnium, bismuth, tin, phosphorus, vanadium, arsenic, antimony, niobium, or tantalum.

The metal oxide-containing film including the element represented by the U exhibits an etching speed faster than that of a metal oxide-containing film without containing the U, and is capable of forming a resist intermediate film which allows for pattern transference thereto even by adopting a resist film pattern obtained from a thinned photoresist film.

Moreover, it is preferable to include the metal oxide-containing compound obtained by the hydrolytic condensation of the hydrolyzable silicon compound represented by the above general formula (1) and the hydrolyzable metal compound represented by the above general formula (2), at a ratio that:

a substance amount of the hydrolyzable silicon compound (1) is greater than a substance amount of the hydrolyzable metal compound (2).

In this way, when silicon in the hydrolyzable silicon compound represented by the general formula (1) is included in an amount greater than that of the element represented by U in the hydrolyzable metal compound represented by the general formula (2), it becomes possible to obtain a more sufficient etching selectivity ratio upon etching the resist lower layer film by using the metal oxide-containing film obtained from the metal oxide-containing film-forming composition provided by the present invention as an etching mask, thereby enabling formation of an intermediate film which allows for pattern transference to the resist lower layer film.

Further, M in the above general formula (4) is preferably a tertiary sulfonium, secondary iodonium, or quaternary ammonium.

In this way, when the metal oxide-containing film is formed by adopting the component (B) where M in the general formula (4) is a tertiary sulfonium, secondary iodonium, or quaternary ammonium, it becomes possible to provide a metal oxide-containing film which has been progressed in cross-linking. Thus, active constituents in the photoresist film formed on the metal oxide-containing film are prevented from migrating to the metal oxide-containing film, thereby allowing to obtain a lithography performance at the same level as typical organic antireflective films, to obtain an excellent resist film pattern.

Furthermore, the thermosetting metal oxide-containing film-forming composition preferably comprises the metal oxide-containing compound having a light-absorbing group.

In this way, when the thermosetting metal oxide has the light-absorbing group, the metal oxide-containing film is made to possess a light absorbability to enable suppression of light reflection even under a high-NA exposure condition, thereby allowing to form a more excellent resist film pattern.

Moreover, M in the above general formula (4) is preferably photo-degradable.

Since M in the general formula (4) is made to be photodegradable, it becomes possible to prevent deterioration of a resist film pattern profile upon exposure.

Preferably, the thermosetting metal oxide-containing film-forming composition further comprises water.

In this way, by adding water into the thermosetting metal oxide-containing film-forming composition, reactive end groups of the metal oxide-containing compound are activated, thereby allowing to obtain a denser film by reaction of thermosetting. Using such a denser metal oxide-containing film allows a lithography performance of a photoresist film formed on the former film, to be at the same or higher level as or than that in case of adopting a typical organic antireflective film.

Preferably, the thermosetting metal oxide-containing film-forming composition further comprises a photoacid generator.

In this way, since the thermosetting metal oxide-containing film-forming composition further comprises a photoacid generator, it becomes possible to produce an acid within the metal oxide-containing film upon formation of the resist film pattern, thereby enabling to prevent deterioration of a resist film pattern profile.

Preferably, the thermosetting metal oxide-containing film-forming composition further comprises a monovalent or divalent or higher alcohol having a cyclic ether as a substitutional group.

In this way, when the monovalent or divalent or higher alcohol, which has a cyclic ether as a substitutional group and which acts as a stabilizer, is added into the thermosetting metal oxide-containing film-forming composition, condensation therein at or near a room temperature can be inhibited, thereby enabling to drastically improve the storage stability of the thermosetting metal oxide-containing film-forming composition.

Further, the present invention provides a substrate comprising, at least:

an organic film formed on the processing substrate;

a metal oxide-containing film formed from the thermosetting metal oxide-containing film-forming composition of the present invention on the organic film; and a photoresist film formed on the metal oxide-containing film.

In this way, by using a substrate formed thereon with a three-layered resist film comprising an organic film, a metal oxide-containing film, and a photoresist film in a manner to form a pattern on the substrate by lithography, the formed pattern can be made fine with a higher precision.

Further, the substrate provided by the present invention further comprises an organic antireflective film formed between the metal oxide-containing film and the photoresist film.

Formation of the organic antireflective film between the metal oxide-containing film and the photoresist film allows for obtainment of a more excellent resist film pattern.

Furthermore, in the substrate provided by the present invention, the organic film has an aromatic skeleton.

In this way, by using the organic film having an aromatic skeleton, the organic film is made to not only exhibit an antireflective effect in a lithographic process but also possess a sufficient etching resistance when the substrate is processed by the etching, thereby enabling advantageous etching.

Moreover, in the substrate provided by the present invention, the photoresist film is formed using a chemically amplified resist composition.

In this way, it is possible to use a chemically amplified resist composition as a photoresist film.

The present invention further provides a patterning process for forming a pattern on a substrate by lithography, comprising the steps of:

forming a metal oxide-containing film formed from the thermosetting metal oxide-containing film-forming composition of the present invention on an organic film formed on the substrate;

forming a photoresist film on the metal oxide-containing film;

subsequently conducting exposure of a pattern circuit region of the photoresist film, developing it by a developer to form a resist film pattern in the photoresist film, and dry etching the metal oxide-containing film by using the thus obtained resist film pattern as an etching mask;

etching the organic film by using the thus obtained metal oxide-containing film pattern as an etching mask; and etching the substrate by using the thus patterned organic film as an etching mask, to form a pattern on the substrate.

Furthermore, the present invention provides a patterning process for forming a pattern on a substrate by lithography, comprising the steps of:

forming a metal oxide-containing film formed from the thermosetting metal oxide-containing film-forming composition of the present invention, on an organic film formed on the substrate;

forming an organic antireflective film on the metal oxide-containing film;

forming a photoresist film on the organic antireflective film;

subsequently conducting exposure of a pattern circuit region of the photoresist film, developing it by a developer to form a resist film pattern in the photoresist film, and dry etching the organic antireflective film and the metal oxide-containing film by using the thus obtained resist film pattern as an etching mask;

etching the organic film by using the thus obtained metal oxide-containing film pattern as an etching mask; and etching the substrate by using the thus patterned organic film as an etching mask, to form a pattern on the substrate.

The patterning process using such a three-layered resist process enables formation of a fine pattern on a substrate with a higher precision.

Preferably, the lithography is conducted by using light having a wavelength of 300 nm or shorter.

In this way, by forming a pattern by lithography adopting light having a wavelength of 300 nm or shorter, particularly ArF excimer laser, the formed pattern can be made fine with a higher precision.

By using the thermosetting metal oxide-containing film-forming composition of the present invention as explained above, it becomes possible to:

(1) obtain a metal oxide-containing film, which allows for formation of an excellent resist film pattern even under a high-NA exposure condition in both a dried state and a liquid immersion state;

(2) obtain a metal oxide-containing film, which is capable of exhibiting, as a dry etching mask, sufficient etching selectivity ratios relative to an overlying photoresist film and an underlying organic film, respectively, thereby forming a pattern on a substrate with a higher precision;

(3) obtain a metal oxide-containing film-forming composition, which has an excellent storage stability, and is unchanged in lithography performance even by long-term storage; and (4) form a metal oxide-containing film, which can be subjected to wet delamination for utilizing a sulfuric acid/hydrogen peroxide mixture or ammonia/hydrogen peroxide mixture typically used in a conventional semiconductor device production process.

DETAILED DESCRIPTION OF THE PREFERRED EMBODIMENTS

The present invention will be described more concretely.

As described above, it has been regarded as being necessary for a metal oxide-containing film as a resist intermediate film having been conventionally used in a multi-layer resist process: to allow for formation of an excellent resist film pattern even under a high-NA exposure condition; to be capable of exhibiting, as a dry etching mask, a sufficient etching selectivity ratio between an overlying photoresist film and an underlying organic film; to have an excellent storage stability of the composition therefor; and to be capable of wet delamination.

Then, the present inventors have found out that it is possible to form a metal oxide-containing film: which film allows for formation of an excellent resist film pattern even under a high-NA exposure condition; which film is capable of exhibiting, as a dry etching mask, a sufficient etching selectivity ratio between an overlying photoresist film and an underlying organic film; a composition for which film has an excellent storage stability; and which film is capable of wet delamination;

by using a thermosetting metal oxide-containing film-forming composition for forming a metal oxide-containing film to be formed in a multi-layer resist process used in lithography, the thermosetting metal oxide-containing film-forming composition comprising, at least:

(A) a metal oxide-containing compound obtained by hydrolytic condensation of: one kind or two or more kinds of hydrolyzable silicon compounds represented by the following general formula (1); and one kind or two or more kinds of hydrolyzable metal compounds represented by the following general formula (2):

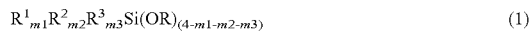

$$R^1{}_{m1}R^2{}_{m2}R^3{}_{m3}Si(OR)_{(4-m1-m2-m3)} \quad (1)$$

wherein R is an alkyl group having 1 to 6 carbon atoms; $R^1$, $R^2$, and $R^3$ are each a hydrogen atom or a monovalent organic group having 1 to 30 carbon atoms;
m1, m2, and m3 are 0 or 1; and
m1+m2+m3 is an integer from 0 to 3

$$U(OR^4)_{m4}(OR^5)_{m5} \quad (2)$$

wherein $R^4$ and $R^5$ are an organic group having 1 to 30 carbon atoms;
m4+m5 is a valence to be determined by a kind of U;
m4 and m5 are an integer of 0 or more; and
U is an element belonging to group III, group IV or group V in the periodic table, except for silicon and carbon (B) one kind or two or more kinds of thermal crosslinking accelerators represented by the following general formula (3) or (4):

$$L_aH_bX \quad (3)$$

wherein L is lithium, sodium, potassium, rubidium, or cesium;
X is a hydroxyl group, or a monovalent, divalent or higher organic acid group having 1 to 30 carbon atoms;
a is an integer of 1 or more;
b is an integer of 0 or 1 or more; and
a+b is a valence of the hydroxyl group or organic acid group

$$M_a \cdot H_b \cdot A \quad (4)$$

wherein M is sulfonium, iodonium, or ammonium;
A is a hydroxyl group, a monovalent, divalent, or higher organic acid group having 1 to 30 carbon atoms, or a non-nucleophilic counter ion;
a' is an integer of 1 or more;
b' is an integer of 0 or 1 or more; and
a'+b' is a valence of the hydroxyl group, organic acid group, or non-nucleophilic counter ion (C) a monovalent, divalent, or higher organic acid having 1 to 30 carbon atoms;

(D) a trivalent or higher alcohol; and (E) an organic solvent.

Generally, when a hydrolyzable silicon compound and a hydrolyzable metal compound (both will be collectively called "monomers" hereinafter) are affected by water in the presence of a hydrolytic condensation catalyst, hydrolyzable substitutional groups bonded to the monomers are subjected to hydrolysis, to form reactive end groups, respectively. These reactive end groups are subjected to condensation reaction with another reactive end group or an unreacted hydrolyzable group, thereby forming a —SiOSi— bond, —SiOU— bond, or —UOU— bond. This reaction is successively and repetitively caused, to resultingly form a metal oxide-containing compound, so-called an oligomer, polymer, or a sol as the case may be. At this time, the condensation reaction is progressed sequentially from the reactive end group having the highest reactivity among those reactive end groups derived from monomers, oligomers, polymers, and the like produced by hydrolysis reaction in the system, in a manner to consume reactive end groups belonging to the monomers, oligomers, polymers, and the like, thereby forming a metal oxide-containing compound. Moreover, such a condensation reaction occasionally progresses endlessly, to an extent that the metal oxide-containing compound solution is eventually gelated. At this time, silanol groups having relatively low reactivities are eventually and frequently left as reactive end groups, respectively.

It is known that these reactive end groups are sometimes inhibited in condensation reaction at a specific pH, as described in C. J. Brinker and G. W. Scherer, "Sol-Gel Science: The Physics and Chemistry of Sol-Gel Processing", Academic Press, San Diego, p. 120 (1990), for example, and it has been particularly described in J. Appl. Polym. Sci., Vol. 88, 636-640 (2003) that the reactive end groups are stabilized at a pH of about 1.5 (hereinafter called "stabilizing pH").

According to the present invention, it has been found out that a condensation reaction is inhibited at a room temperature and thus the storage stability of the subject composition is improved, in case of controlling a pH thereof at the stabilizing pH for restricting the condensation reaction, by means of the monovalent, divalent, or higher organic acid (C) having 1 to 30 carbon atoms.

Further, the present inventors have found out that the metal oxide-containing film can be effectively cured by changing a pH around a reactive end group from the pH for inhibiting a condensation reaction to a pH region (around pH 3, as described by C. J. Brinker and G. W. Scherer, "Sol-Gel Science: The Physics and Chemistry of Sol-Gel Processing", Academic Press, San Diego, 1990) for causing a condensation reaction by virtue of the action of the added component (B) upon heat curing the coated composition, such that, when heated and cured under the same temperature condition as the conventional, a film remarkably progressed in cross-linking can be provided as compared with a conventionally cured film; resulting in that migration of active components in the overlying photoresist film to the metal oxide-containing film can be inhibited to obtain a lithographic characteristic of the metal oxide-containing film at the same level as a typical organic antireflective film, thereby allowing for obtainment of an excellent resist film pattern.

In this way, the present inventors have found out the composition which is stable at the room temperature and which is effectively cured upon thermosetting by virtue of the technical combination of the monovalent, divalent, or higher organic acid having 1 to 30 carbon atoms (C) with the thermal crosslinking accelerator(s) (B), thereby allowing for obtainment of the metal oxide-containing film-forming composition for forming a metal oxide-containing film having a stability equivalent to that of a conventional organic antireflective film. The present inventors have further found out that, adoption of the thermosetting metal oxide-containing film-forming composition of the present invention allows for formation of a metal oxide-containing film which can exhibit sufficient etching selectivity ratios relative to a photoresist film as a resist upper layer film and an organic film as a resist lower layer film, respectively. Further, addition of the trivalent or higher alcohol (D) causes dehydration between a silanol and the alcohol, so that the product of the alcohol is caught into the film. The present inventors have found out that this carbon moiety is readily attacked by a delamination agent such that this moiety is decomposed and thus the coated film is readily decomposed, thereby enabling wet delamination.

In the thermosetting metal oxide-containing film-forming composition of the present invention, the metal oxide-containing compound (A) to be used in the present invention is obtained by hydrolytic condensation of the hydrolyzable silicon compound and the hydrolyzable metal compound. Examples of production methods of preferable metal oxide-containing compounds exemplarily include the following ones, without limited thereto.

The hydrolyzable silicon compound (monomer) as one of the starting materials can be represented by the following general formula (1):

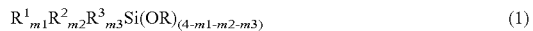

$$R^1_{m1}R^2_{m2}R^3_{m3}Si(OR)_{(4-m1-m2-m3)} \quad (1)$$

wherein R is an alkyl group having 1 to 6 carbon atoms;
$R^1$, $R^2$, and $R^3$ are each a hydrogen atom or a monovalent organic group having 1 to 30 carbon atoms;
m1, m2, and m3 are 0 or 1; and
m1+m2+m3 is an integer from 0 to 3, preferably 0 or 1.

Herein, the term "organic group" means a group, which includes carbon, and which may additionally include hydrogen, as well as nitrogen, oxygen, sulfur, silicon or the like. Examples of the organic groups represented by $R^1$, $R^2$, and $R^3$ include: unsubstituted monovalent hydrocarbon groups, such as linear, branched or cyclic alkyl, alkenyl, alkynyl, aryl and aralkyl groups; substituted groups, which one or more hydrogen atoms of the above groups are substituted with an epoxy group, alkoxy group, hydroxy group, or the like; groups exemplarily represented by the general formula (6) to be shown later, including intervening groups such as —O—, —CO—, —OCO—, —COO—, or —OCOO—; and organic groups including a silicon-silicon bond.

Suitable as $R^1$, $R^2$, and $R^3$ in the monomers represented by the general formula (1) are: a hydrogen atom; alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl groups; alkenyl groups such as vinyl and allyl groups; alkynyl groups such as ethynyl group; and, as light-absorbing groups, aryl groups such as phenyl and tolyl groups, and aralkyl groups such as benzyl and phenethyl groups.

Examples of tetraalkoxysilanes as monomers where m1=0, m2=0 and m3=0 include tetramethoxysilane, tetraethoxysilane, tetra-n-propoxysilane, and tetraisopropoxysilane. Tetramethoxysilane and tetraethoxysilane are preferable among them.

Examples of trialkoxysilanes where m1=1, m2=0 and m3=0 include trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, i-propyltrimethoxysilane, i-propyltriethoxysilane, propyltri-n-propoxysilane, i-propyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, and adamantyltriisopropoxysilane. Further, examples of light-absorbing monomers in this respect include phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, and naphthyltriisopropoxysilane.

Preferable examples of trialkoxysilanes include methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane.

Examples of dialkoxysilanes where m1=1, m2=1 and m3=0 include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyl-di-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, and bisadamantyldiisopropoxysilane. Further, examples of light-absorbing monomers in this respect include diphenyldimethoxysilane, diphenyldiethoxysilane, methylphenyldimethoxysilane, methylphenyldiethoxysilane, diphenyldi-n-propoxysilane, and diphenyldiisopropoxysilane.

Preferable examples of dialkoxysilanes include dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, and methylphenyldiethoxysilane.

Examples of monoalkoxysilanes where m1=1, m2=1 and m3=1 include trimethylmethoxysilane, trimethylethoxysilane, dimethylethylmethoxysilane, and dimethylethylethoxysilane. Further, examples of light-absorbing monomers in this respect include dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples of monoalkoxysilanes include trimethylmethoxysilane, dimethylethylmethoxysilane, dimethylphenylmethoxysilane, dimethylbenzylmethoxysilane, and dimethylphenethylmethoxysilane.

Other examples of the organic groups represented by $R^1$, $R^2$, and $R^3$ include organic groups having one or more carbon-oxygen single bonds or carbon-oxygen double bonds. Concrete examples include organic groups having one or more groups selected from a group consisting of epoxy, ester, alkoxy, and hydroxyl groups. Examples of organic groups having one or more carbon-oxygen single bonds or carbon-oxygen double bonds in the general formula (1) include those represented by the following general formula (6):

$$(P-Q_1-(S_1)_{v1}-Q_2-)_u-(T)_{v2}-Q_3-(S_2)_{v3}-Q_4- \quad (6)$$

wherein P is a hydrogen atom, hydroxyl group, epoxy ring

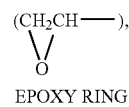
EPOXY RING an alkoxy group having 1 to 4 carbon atoms, alkylcarbonyloxy group having 1 to 6 carbon atoms, or alkylcarbonyl group having 1 to 6 carbon atoms;

$Q_1$, $Q_2$, $Q_3$ and $Q_4$ are independently $-C_qH_{(2q-p)}P_p-$ (where P is the same as the above, p is an integer of 0 to 3, and q is an integer of 0 to 10 (q=0 represents a single bond));

u is an integer of 0 to 3;

$S_1$ and $S_2$ independently represent $-O-$, $-CO-$, $-OCO-$, $-COO-$, or $-OCOO-$; and v1, v2, and v3 independently represent 0 or 1.

Simultaneously with the above, T is a divalent group comprising an alicycle or aromatic ring which may contain a heteroatom, and examples of alicycles or aromatic rings of T which may include a heteroatom such as oxygen atoms in T are listed below. Those sites of T which are bonded to $Q_2$ and $Q_3$ are not particularly limited, and such sites may be appropriately selected in view of reactivities based on steric factors and availabilities of commercial reagents to be used in the reaction).

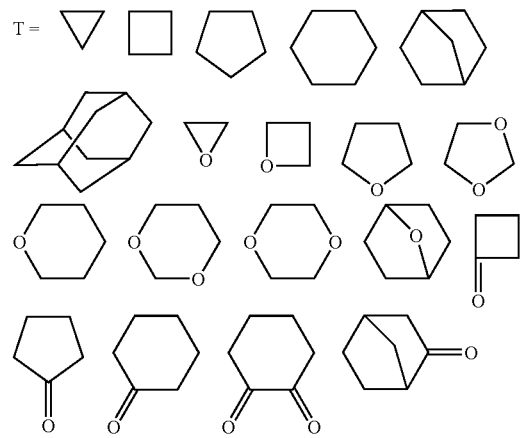

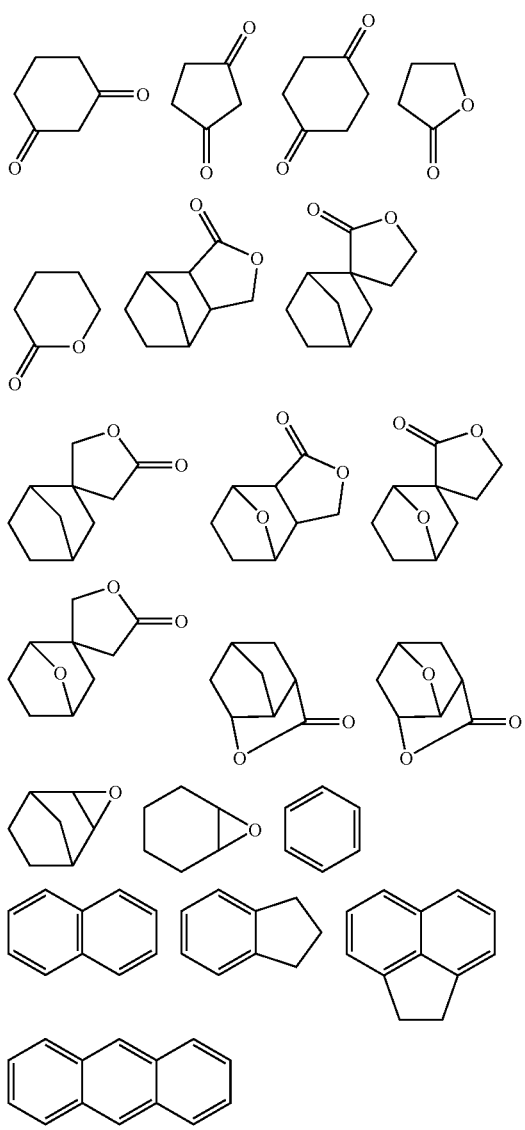
Preferable examples of organic groups in the general formula (1) having one or more carbon-oxygen single bonds or carbon-oxygen double bonds, include the following. Note that the following formulae include a symbol "(Si)" depicted to show a bonding site to Si.
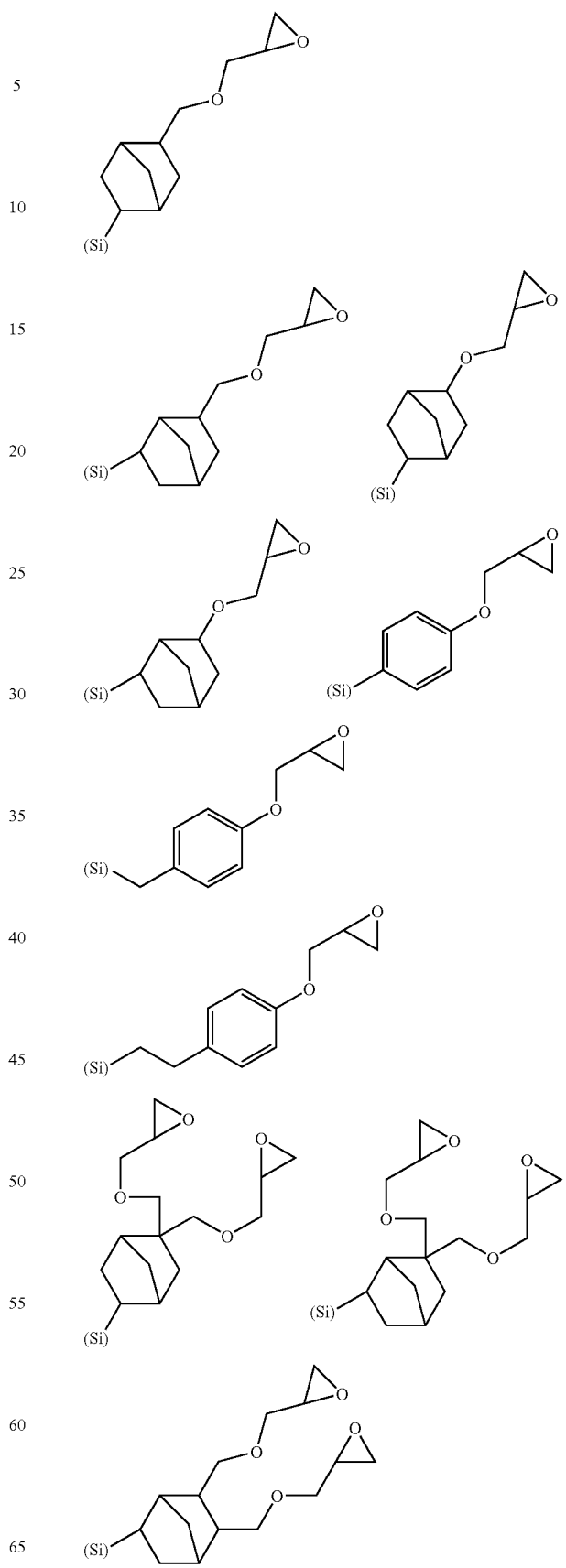

-continued
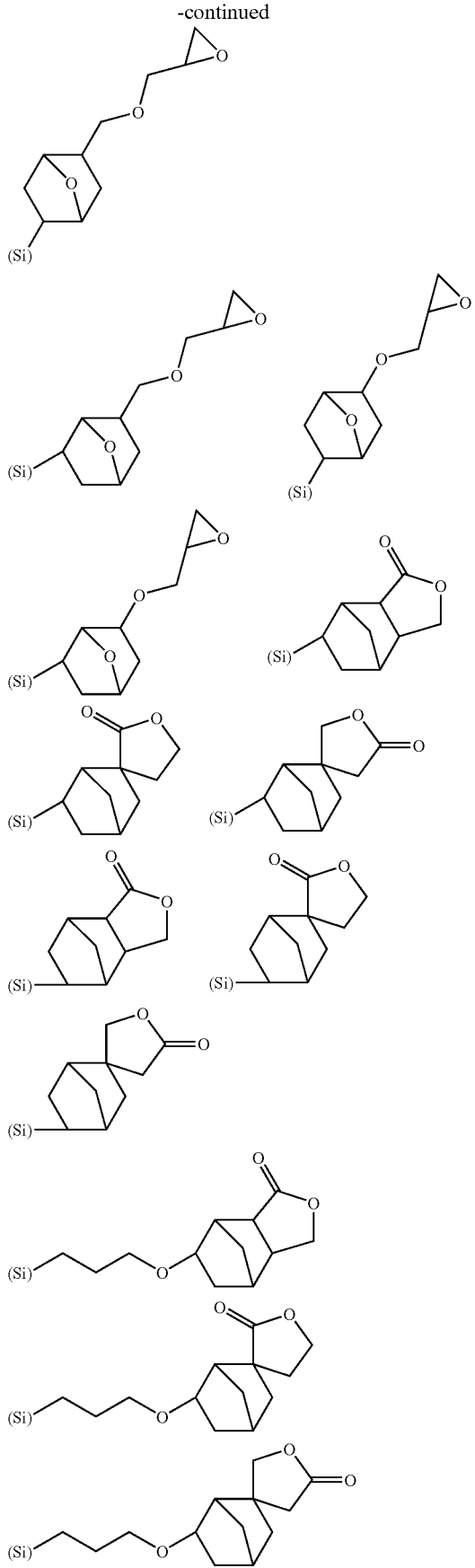
-continued
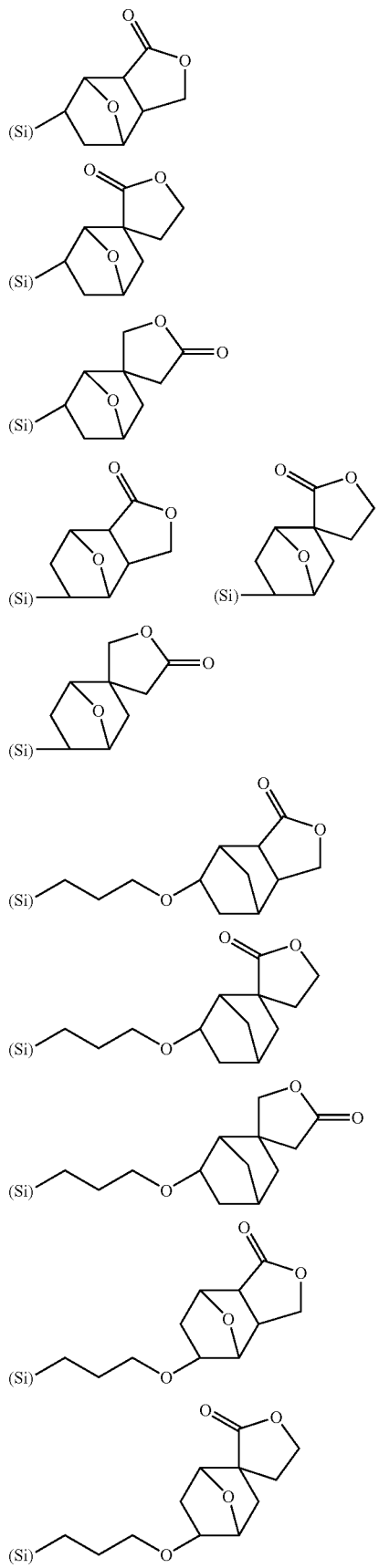

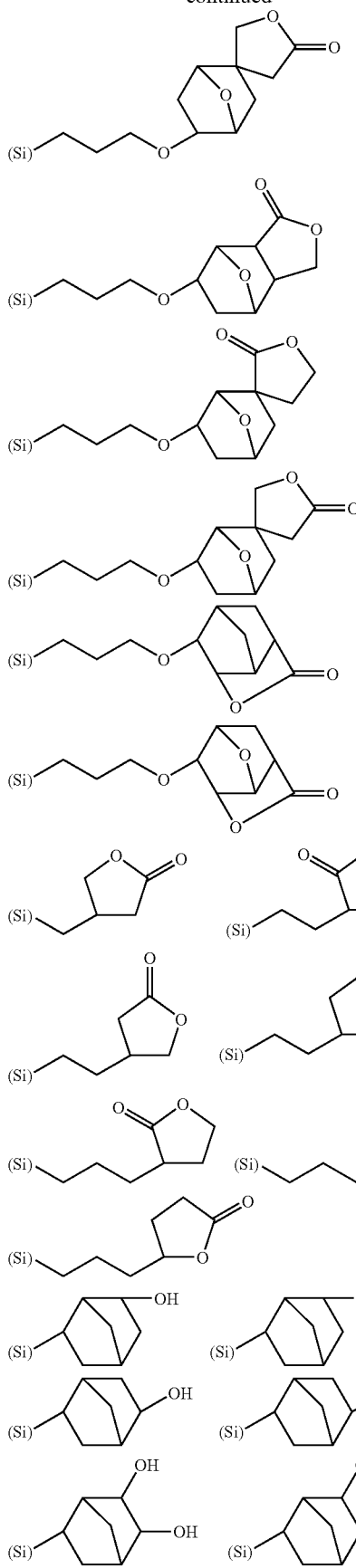
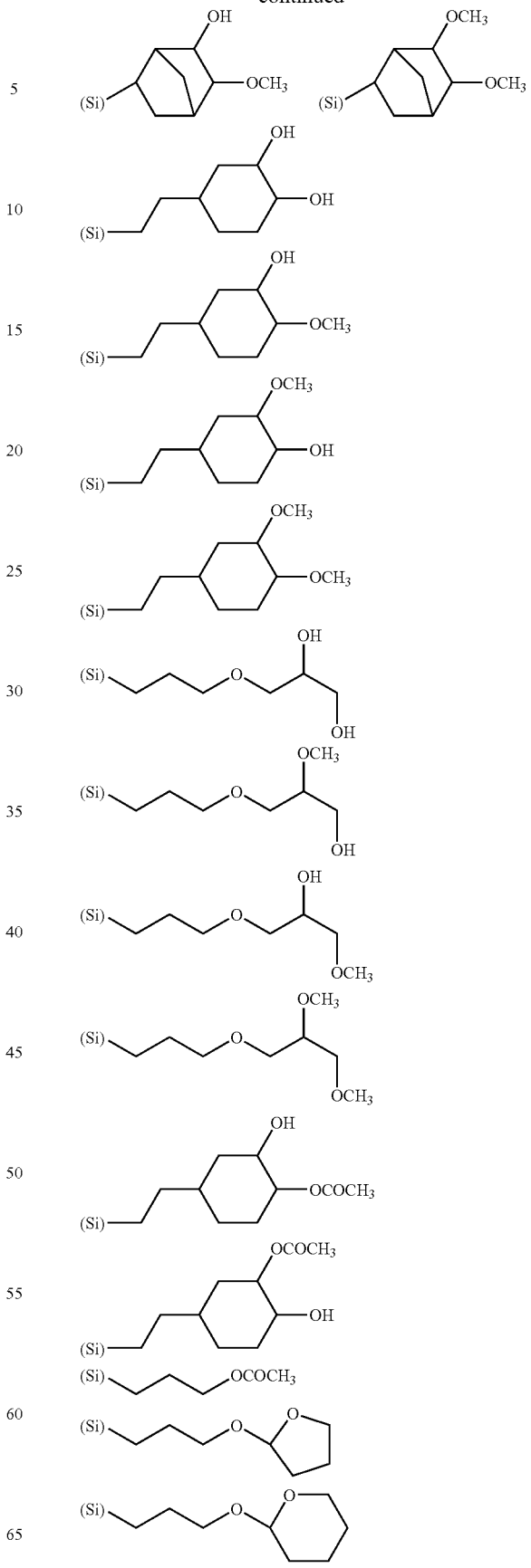

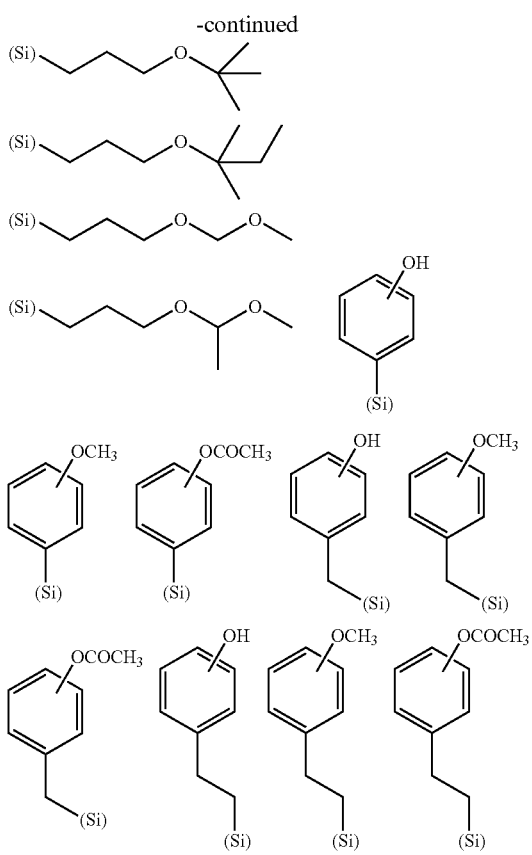

Further, usable examples of organic groups represented by $R^1$, $R^2$, and $R^3$ include organic groups including silicon-silicon bonds. Concrete examples include the following.

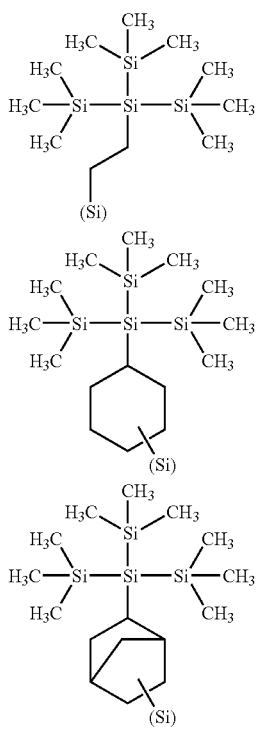

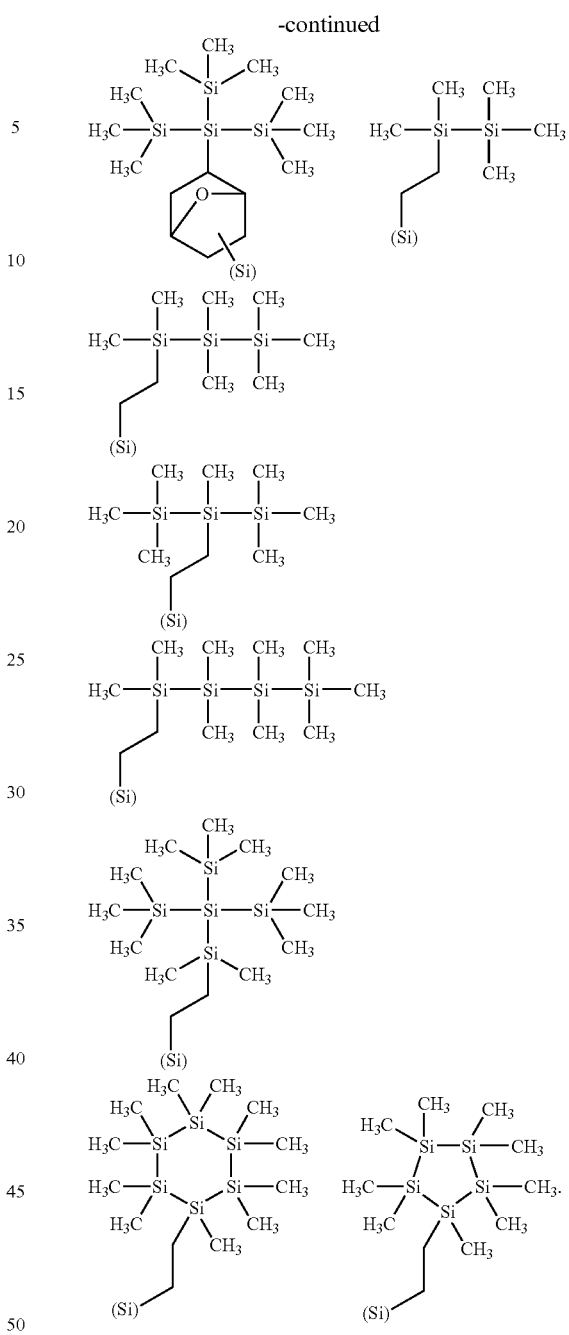

The hydrolyzable metal compound (monomer), as the other starting material which is subjected to hydrolytic condensation with the hydrolyzable silicon compound, can be represented by the following general formula (2):

$$U(OR^4)_{m4}(OR^5)_{m5} \quad (2)$$

wherein $R^4$ and $R^5$ are an organic group having 1 to 30 carbon atoms;

m4+m5 is a valence to be determined by a kind of U;

m4 and m5 are an integer of 0 or more; and

U is an element belonging to group III, group IV or group V in the periodic table, except for silicon and carbon.

Herein, the term "organic group" means a group, which includes carbon, and which may additionally include hydrogen, as well as nitrogen, oxygen, sulfur, silicon or the like. Examples of $R^4$ and $R^5$ include: unsubstituted monovalent hydrocarbon groups, such as linear, branched or cyclic alkyl, alkenyl, alkynyl, aryl and aralkyl groups; substituted groups, which one or more hydrogen atoms of the above groups is substituted with an epoxy group, alkoxy group, hydroxy group, or the like; and groups including intramolecular intervening groups such as —O—, —CO—, —OCO—, —COO—, or —OCOO—.

U is an element belonging to group III, group IV or group V in the periodic table, except for silicon and carbon; and preferable for the present invention are boron, aluminum, gallium, yttrium, germanium, titanium, zirconium, hafnium, bismuth, tin, phosphorus, vanadium, arsenic, antimony, niobium, or tantalum.

When U is boron, examples of the compounds represented by the formula (2) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, and boron methoxyethoxide.

When U is aluminum, examples of the compounds represented by the formula (2) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the compounds represented by the formula (2) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the compounds represented by the formula (2) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the compounds represented by the formula (2) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the compounds represented by the formula (2) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is zirconium, examples of the compounds represented by the formula (2) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis(2,2,6,6-tetramethyl-3,5-heptanedionate).

When U is hafnium, examples of the compounds represented by the formula (2) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is bismuth, examples of the compounds represented by the formula (2) include, as monomers, methoxy bismuth, ethoxy bismuth, propoxy bismuth, butoxy bismuth, and phenoxy bismuth.

When U is tin, examples of the compounds represented by the formula (2) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When U is phosphorus, examples of the compounds represented by the formula (2) include, as monomers, trimethyl phosphite, triethyl phosphite, tripropyl phosphite, trimethyl phosphate, triethyl phosphate, and tripropyl phosphate.

When U is vanadium, examples of the compounds represented by the formula (2) include, as monomers, vanadium oxide-bis(2,4-pentanedionate), vanadium 2,4-pentanedionate, vanadium tributoxide oxide, and vanadium tripropoxide oxide.

When U is arsenic, examples of the compounds represented by the formula (2) include, as monomers, methoxy arsenic, ethoxy arsenic, propoxy arsenic, butoxy arsenic, and phenoxy arsenic.

When U is antimony, examples of the compounds represented by the formula (2) include, as monomers, methoxy antimony, ethoxy antimony, propoxy antimony, butoxy antimony, phenoxy antimony, antimony acetate, and antimony propionate.

When U is niobium, examples of the compounds represented by the formula (2) include, as monomers, methoxy niobium, ethoxy niobium, propoxy niobium, butoxy niobium, and phenoxy niobium.

When U is tantalum, examples of the compounds represented by the formula (2) include, as monomers, methoxy tantalum, ethoxy tantalum, propoxy tantalum, butoxy tantalum, and phenoxy tantalum.

It is possible to select one kind or two or more kinds of monomers represented by the above general formula (1) and one kind or two or more kinds of monomers represented by the above general formula (2), and to mix them before or during the reaction, to prepare a reaction starting material for forming a metal oxide-containing compound.

The metal oxide-containing compound (A) to be used in the present invention can be produced, by conducting hydrolytic condensation between monomers represented by the general formula (1) and monomers represented by the general formula (2), while adopting, as an acid catalyst, one or more kinds of compounds preferably selected from inorganic acids, aliphatic sulfonic acids, and aromatic sulfonic acids.

Examples of the acid catalyst to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in an amount of $10^{-6}$ to 10 moles, preferably $10^{-5}$ to 5 moles, more preferably $10^{-4}$ to 1 mole, relative to 1 mole of monomers.

The amount of water upon obtainment of the metal oxide-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts exceeding 100 moles are uneconomical, due to merely large-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are preferable among them.

Note that the usage amount of the organic solvent is preferably to be 0 to 1,000 ml, particularly preferably 0 to 500 ml, relative to 1 mole of monomers. Excessive usage amounts of the organic solvent uneconomically lead to excessively large reaction vessels.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove by-products such as alcohols produced by the hydrolytic condensation reaction, from the reaction product mixture. Although the temperature for heating the reaction product mixture at this time depends on the kinds of the added organic solvent and alcohols and the like produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove 80 mass % or more of produced alcohols and the like.

Next, it is possible to remove the acid catalyst used for the hydrolytic condensation, from the reaction product mixture.

Those silicon-containing compounds produced by the conventional techniques have been used in coated film-forming compositions, substantially without removing acid catalysts used upon hydrolytic condensation. Since this causes a catalyst(s) for condensation reaction to be left in composition, it is impossible to restrict condensation of silanol groups even when the composition has been controlled at pH for inhibiting a condensation reaction, thereby merely obtaining the composition having an inferior storage stability.

It is known that the condensation reaction can be inhibited at a specific pH (J. Appl. Polym. Sci., Vol. 88, 636-640 (2003), and C. J. Brinker and G. W. Scherer, "Sol-Gel Science: The Physics and Chemistry of Sol-Gel Processing", Academic Press, San Diego (1990)), and it has been described therein that the reaction is stabilized at a pH of about 1.5 ("stabilizing pH").

However, in case of a coated film-forming composition obtained by using such an acidic substance for keeping silanol groups at the stabilizing pH from the first, the condensation reaction of silanol groups is not sufficiently progressed, thereby resulting in a larger amount of residual silanol groups. Thus, it is merely possible to obtain a composition having an inferior storage stability even when the composition is kept at the stabilizing pH, because the amount of silanol groups is excessive.

In the present invention, after the acid catalyst, which is optimum for hydrolytic condensation, is substantially removed from the metal oxide-containing compound obtained by using the acid catalyst, the component (C) is used to control the resultant compound at a stabilizing pH, thereby enabling an improved storage stability thereof.

As a procedure for removing the acid catalyst, the metal oxide-containing compound is mixed with water, and the metal oxide-containing compound is extracted with an organic solvent. Suitable as an organic solvent to be used then, is one which allows for dissolution of the metal oxide-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water—hardly soluble organic solvent.

The procedure is followed by washing by neutral water. Usable as such water is so-called deionized water or ultrapure water. The amount of such water is to be 0.01 to 100 L, preferably 0.05 to 50 L, and more preferably 0.1 to 5 L, relative to 1 L of the metal oxide-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the acid catalyst include a method based on an ion-exchange resin, and a method for conducting neutralization by epoxy compounds such as ethylene oxide and propylene oxide followed by removal. These methods can be appropriately selected in conformity to the acid catalyst for the reaction.

The phrase that the acid catalyst has been substantially removed in the above catalyst removal operation, means that the acid catalyst used for the reaction is allowed to be left in an amount of about 10 mass % or less, preferably 5 mass % or less, relative to the amount added at the initiation of reaction in the metal oxide-containing compound.

Since a part of the metal oxide-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a metal oxide-containing compound including the acid catalyst left therein and a metal oxide-containing compound solution from which the acid catalyst has been removed, a final solvent is added thereto, and solvent exchange is conducted under reduced pressure, to obtain a resultant metal oxide-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the metal oxide-containing compound is sometimes made unstable, due to exchange of solvents.

This phenomenon is caused depending on the compatibility between the final solvent and the metal oxide-containing compound, and it is possible to add the component (C) to be described later as a stabilizer, so as to prevent the phenomenon. The amount to be added is 0 to 25 parts by mass, preferably 0 to 15 parts by mass, and more preferably 0 to 5 parts by mass relative to 100 parts by mass of the metal oxide-containing compound in the solution before solvent exchange, and 0.5 or more parts by mass are preferable in case of addition. If necessary, it is possible to add the component (C) to the solution before solvent exchange and to subsequently conduct a solvent exchange operation.

When the metal oxide-containing compound is concentrated to a certain concentration or denser, condensation reaction is progressed, so that the compound is changed into a state incapable of being re-dissolved in an organic solvent. As such, the compound is to be preferably kept in a solution state at an appropriate concentration. In turn, excessively diluted compounds uneconomically lead to excessive amounts of solvents. Thus, the suitable concentration in this case is preferably 0.1 to 20 mass %.

Suitable as a final solvent to be added to the metal oxide-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain a resultant metal oxide-containing compound.

Although the molecular weight of the obtained metal oxide-containing compound can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, preferably 200 to 50,000, and more preferably 300 to 30,000, respectively. Note that the data concerning the weight-average molecular weight is obtained as a molecular weight determined by gel permeation chromatography (GPC) using an RI detector and polystyrene standards.

The metal oxide-containing film-forming composition of the present invention is allowed to contain two or more kinds of metal oxide-containing compounds which are mutually different in composition and/or reaction condition, insofar as produced under acidic conditions, respectively.

The thermosetting metal oxide-containing film-forming composition can be prepared by further blending the thermal crosslinking accelerator (B), the monovalent, divalent, or higher organic acid having 1 to 30 carbon atoms (C), the trivalent or higher alcohol (D), and the organic solvent (E) into the metal oxide-containing compound (A).

It is a conventional procedure to cure a metal oxide-containing compound, by high-temperatures of 300° C. or higher, or by an acid catalyst based on a thermal acid generator. In the present invention, the pH around reactive end groups of the compound is changed from a stable value to a value in an unstable pH region upon heat curing the coated composition, by virtue of the action of the component (B), thereby enabling to effectively cure the film. Namely, when heat cured under the same temperature condition as the conventional, it is possible to provide a film extremely progressed in cross-linking as compared with a conventionally cured film. This inhibits migration of active components in a resist film to the metal oxide-containing film, thereby enabling obtainment of a lithographic characteristic equivalent to that of a typical organic antireflective film.

In this way, the thermal crosslinking accelerator as the component (B) is contained in the composition of the present invention so as to further promote a cross-linking reaction upon formation of the metal oxide-containing film. Examples of such a thermal crosslinking accelerator include compounds represented by the general formula (3) or (4):

$$L_a H_b X \qquad (3)$$

wherein L is lithium, sodium, potassium, rubidium, or cesium;

X is a hydroxyl group, or a monovalent, divalent or higher organic acid group having 1 to 30 carbon atoms;

a is an integer of 1 or more;

b is an integer of 0 or 1 or more; and a+b is a valence of the hydroxyl group or organic acid group

$$M_{a'} H_{b'} A \qquad (4)$$

wherein M is sulfonium, iodonium, or ammonium;

A is a hydroxyl group, a monovalent, divalent, or higher organic acid group having 1 to 30 carbon atoms, or a non-nucleophilic counter ion;

a' is an integer of 1 or more;

b' is an integer of 0 or 1 or more; and a'+b' is a valence of the hydroxyl group, organic acid group, or non-nucleophilic counter ion.

Examples of the compound represented by the general formula (3) include alkali metal salts of organic acids. Examples include salts of lithium, sodium, potassium, rubidium and cesium with monovalent acids such as hydroxide, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid; and salts of lithium, sodium, potassium, rubidium and cesium with monovalent or divalent acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Concrete examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoroacetate, lithium monochloroacetate, lithium dichloroacetate, lithium trichloroacetate, lithium hydroxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, and lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoroacetate, sodium monochloroacetate, sodium dichloroacetate, sodium trichloroacetate, sodium hydroxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, and sodium carbonate; and potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoroacetate, potassium monochloroacetate, potassium dichloroacetate, potassium trichloroacetate, potassium hydroxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, and potassium carbonate.

Examples of the compound represented by the general formula (4) include sulfonium compounds, iodonium compounds, and ammonium compounds represented by formulae (Q-1), (Q-2), and (Q-3), respectively:

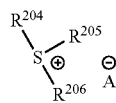
(Q-1)

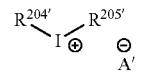
(Q-2)

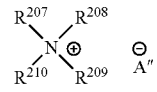
(Q-3)

wherein $R^{204}$, $R^{205}$, $R^{206}$, $R^{204'}$, and $R^{205'}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted by alkoxy groups or the like, and wherein $R^{205}$ and $R^{206}$ may form a ring together with a sulfur atom to which they bond, and when a ring is formed, $R^{205}$ and $R^{206}$ each represent an alkylene group having 1 to 6 carbon atoms;

$A^-$ represents a non-nucleophilic counter ion; and $R^{207}$, $R^{208}$, $R^{209}$, and $R^{210}$ are the same as $R^{204}$, $R^{205}$, $R^{206}$, $R^{204'}$, and $R^{205'}$, and may be a hydrogen atom;

wherein $R^{207}$ and $R^{208}$, or $R^{207}$, $R^{208}$ and $R^{209}$ may form a ring together with a nitrogen atom to which they bond, and when a ring is formed, $R^{207}$ and $R^{208}$, or $R^{207}$, $R^{208}$ and $R^{209}$ represent an alkylene group having 3 to 10 carbon atoms.

$R^{204}$, $R^{205}$, $R^{206}$, $R^{204'}$, $R^{205'}$, $R^{207}$, $R^{208}$, $R^{209}$, and $R^{210}$ may be the same or different from one another, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups.

Examples of $A^-$, $A'^-$, and $A''^-$ include hydroxyl ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, and carbonate ion.

Concrete examples of sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodide, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Concrete examples of iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Concrete examples of ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

Note that the thermal crosslinking accelerators can be used solely in one kind or combinedly in two or more kinds. The addition amount of the thermal crosslinking accelerators is preferably 0.01 to 50 parts by mass, and more preferably 0.1 to 40 parts by mass, relative to 100 parts by mass of the base polymer (i.e., the metal oxide-containing compound of the component (A) obtained by the above procedure).

To ensure stability of the thermosetting metal oxide-containing film-forming composition of the present invention, it is necessary to add a monovalent, divalent, or higher organic acid having 1 to 30 carbon atoms as the component (C). Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Particularly preferable examples include oxalic acid, maleic acid, formic acid, acetic acid, propionic acid, and citric acid. It is possible to mixingly use two or more kinds of acids, so as to keep the stability. The addition amount is 0.001 to 25 parts by mass, preferably 0.01 to 15 parts by mass, and more preferably 0.1 to 5 parts by mass, relative to 100 parts by mass of the metal oxide contained in the composition.

Alternatively, the organic acid is preferably blended in a manner to achieve $0 \leq pH \leq 7$, more preferably $0.3 \leq pH \leq 6.5$, and even more preferably $0.5 \leq pH \leq 6$, when evaluated as a pH of the composition.

Further addition of the trivalent or higher alcohol (D) as a crosslinking agent allows for obtainment of a metal oxide-containing film-forming composition capable of forming a metal oxide-containing film which is removable by a typical delamination agent. Among such trivalent or higher alcohols, alcohols having two or more primary hydroxyl groups are preferable.

Examples thereof include compounds represented by the formulae, respectively:

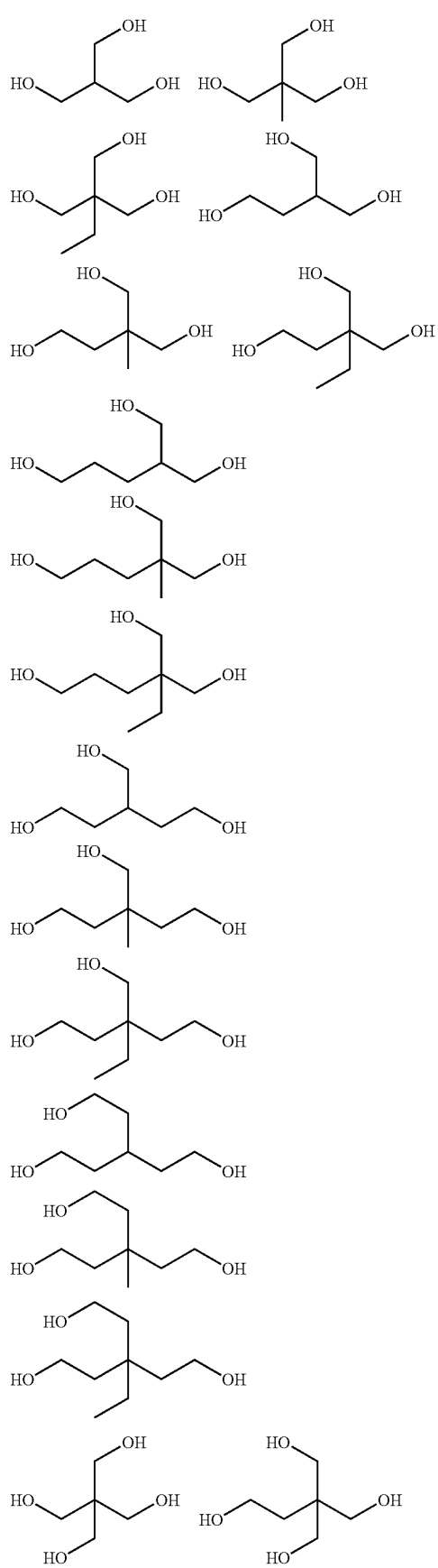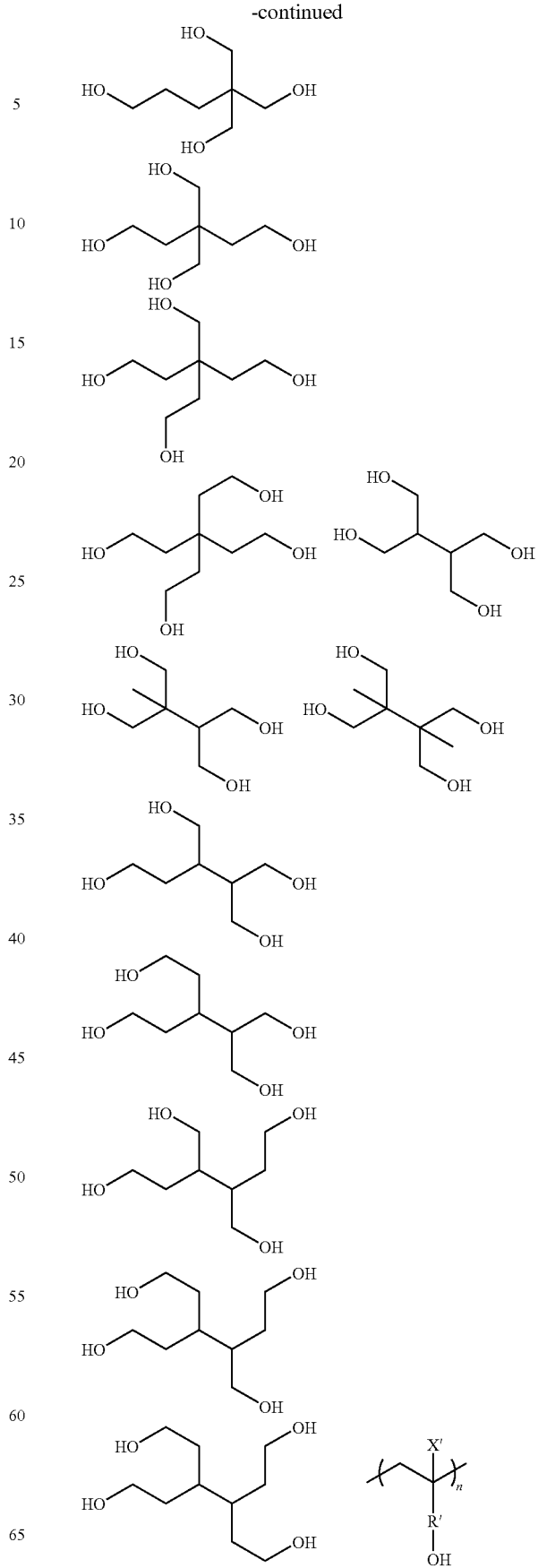

-continued

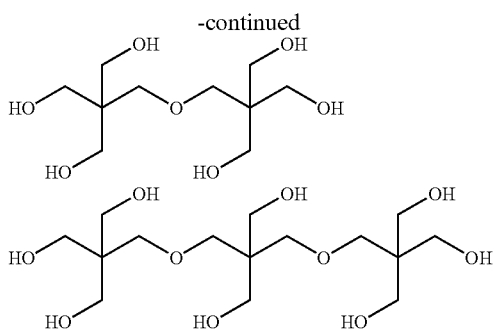

wherein X' is a hydrogen atom or methyl group;

R' is an organic group having 1 or more carbon atoms, where the carbon at the hydroxyl group side is a methylene group; and n is an integer of 3 or more and less than 100.

The above crosslinking agents can be used solely in one kind or combinedly in two or more kinds. The addition amount of the crosslinking agent is preferably 0.001 to 50 parts by mass, more preferably 0.01 to 40 parts by mass relative to 100 parts by mass of base polymer (i.e., the metal oxide-containing compound obtained by the above procedure).

Addition of such a crosslinking agent causes the once cured film to be decomposed by an effect of a delamination agent, from the site of crosslinking agent constituted of carbon atoms, to thereby break the metal oxide-containing film, thereby facilitating delamination thereof.

To be used as the component (E) for the composition of the present invention containing the metal oxide-containing compound, is the same organic solvent as used upon production of the metal oxide-containing compound as described above, and preferable examples to be used include water-soluble organic solvents, particularly monoalkyl ether derivatives of ethylene glycol, diethylene glycol, triethylene glycol, propylene glycol, dipropylene glycol, butanediol, and pentanediol. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether. The usage amount thereof will be described later.

Further, it is possible in the present invention to contain, in the composition, a silicon-containing compound obtained by hydrolytic condensation of hydrolyzable silicon compounds (monomers) represented by the following general formula (5):

$$R^6{}_{m6}R^7{}_{m7}R^8{}_{m8}Si(OR^9)_{(4-m6-m7-m8)} \qquad (5)$$

wherein $R^9$ is an alkyl group having 1 to 6 carbon atoms;

$R^6$, $R^7$, and $R^8$ are each a hydrogen atom, or a monovalent organic group having 1 to 30 carbon atoms;

m6, m7, and m8 are 0 or 1; and m6+m7+m8 is an integer from 0 to 3.

Examples of $R^6$, $R^7$, $R^8$, $R^9$, m6, m7, and m8 used in this formula (5) correspond to $R^1$, $R^2$, $R^3$, $R$, m1, m2, and m3 in the general formula (1), respectively, and are exactly the same as those examples for them, respectively.

The production method of such a silicon-containing compound is exemplarily the same as the production method of the component (A).

Further, the silicon-containing compound usable in the present invention can also be obtained by hydrolyzing and condensing monomers in the presence of a base catalyst. Examples of preferable production methods of silicon-containing compounds exemplarily include the following ones, without limited thereto.

Usable as monomers acting as a starting material are those which are represented by the general formula (1), and which are concretely described in the paragraphs [0074] to [0092].

The silicon-containing compound can be produced by conducting hydrolytic condensation of the monomers in the presence of a base catalyst.

Examples of the base catalyst to be used then include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The usage amount of the catalyst is $10^{-6}$ to 10 moles, preferably $10^{-5}$ to 5 moles, more preferably $10^{-4}$ to 1 mole, relative to 1 mole of monomers.

The amount of water to be added upon obtainment of the silicon-containing compound from these monomers by hydrolytic condensation, is preferably 0.1 to 50 moles per mole of hydrolyzable substitutional groups bonded to the monomers. Addition amounts exceeding 50 moles are uneconomical, due to merely large-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether; acetone; acetonitrile; and tetrahydrofuran.

Those having boiling points of 100° C. or lower are preferable among them.

The amount of the organic solvent to be used is preferably 0 to 1,000 ml relative to 1 mole of monomers. Excessive usage amounts of the organic solvent uneconomically lead to excessively large reaction vessels.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an acidic substance usable for neutralization is preferably 0.1 to 2 equivalents relative to the base used as the catalyst. This acidic substance is arbitrary, insofar as the substance exhibits acidity in water.

Subsequently, it is necessary to remove alcohols produced by the hydrolytic condensation reaction, from the reaction product mixture. Although the temperature for heating the reaction product mixture at this time depends on the kinds of the added organic solvent and alcohols produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove 80 mass % or more of produced alcohols.

Next, the silicon-containing compound is extracted with an organic solvent, so as to remove the catalyst used in hydrolytic condensation. Suitable as an organic solvent to be used then, is one which allows for dissolution of the silicon-containing compound therein and which is separated in a two-layered when mixed with the water. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water-hardly soluble organic solvent. Examples of preferable mixtures include, without limited thereto, combinations of methanol+ethyl acetate, ethanol+ethyl acetate, 1-propanol+ethyl acetate, 2-propanol+ethyl acetate, propylene glycol monomethyl ether+ethyl acetate, ethylene glycol monomethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water-hardly soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

The procedure is followed by washing by neutral water. So-called deionized water or ultrapure water is usable as such water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Added into the washed silicon-containing compound solution is a final solvent, to conduct solvent exchange under reduced pressure, thereby obtaining a resultant silicon-containing compound solution. Although the temperature for solvent exchange at this time depends on the type of extraction solvent to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain a resultant silicon-containing compound.

Although the molecular weight of the obtained silicon-containing compound can be adjusted not only by selection of monomers but also by control of reaction condition upon polymerization, adoption of compounds having weight-average molecular weights exceeding 1,000,000 occasionally cause occurrence of extraneous substances or coating patch, so that those compounds are to be preferably used which have weight-average molecular weights of 800,000 or less, preferably 200 to 500,000, and more preferably 300 to 300,000, respectively. Note that the data concerning the weight-average molecular weight is obtained as a molecular weight determined by gel permeation chromatography (GPC) using an RI detector and polystyrene standards.

Although the blending ratio of the obtained silicon-containing compound relative to the metal oxide-containing compound (A) component may be an arbitrary value, the blending ratio is preferably such that the metal oxide-containing compound is greater than the silicon-containing compound in terms of mass ratio, depending on the performance of a film to be obtained.

In the present invention, water may be added to the thermosetting metal oxide-containing film-forming composition. Addition of water causes the metal oxide-containing compound to be hydrated, thereby improving lithography performance thereof. The content rate of water in the solvent components of the thermosetting metal oxide-containing film-forming composition is preferably more than 0 mass % and less than 50 mass %, more preferably 0.3 to 30 mass %, and even more preferably 0.5 to 20 mass %. Excessively large amounts of the respective components result in a deteriorated uniformity of a coated film, and causing eye holes at the worst. Contrary, excessively small amounts disadvantageously deteriorate the lithography performance.

The usage amount of all the solvents including water is preferably 500 to 100,000 parts by mass, and particularly 400 to 50,000 parts by mass, relative to 100 parts by mass of the base polymer of the component (A).

In the present invention, it is possible to use a photoacid generator. Examples of photoacid generators to be used in the present invention include:

(A-I) onium salts of the following formula (P1a-1), (P1a-2) or (P1b), (A-II) diazomethane derivatives of the following formula (P2), (A-III) glyoxime derivatives of the following formula (P3), (A-IV) bissulfone derivatives of the following formula (P4), (A-V) sulfonate esters of N-hydroxyimide compounds of the following formula (P5), (A-VI) β-ketosulfonic acid derivatives, (A-VII) disulfone derivatives, (A-VIII) nitrobenzylsulfonate derivatives, and (A-IX) sulfonic ester derivatives.

(P1a-1)

(P1a-2)

Wherein $R^{101a}$, $R^{101b}$, $R^{101c}$, $R^{101d}$, and $R^{101e}$ are each linear, branched or cyclic alkyl, alkenyl, oxoalkyl or oxoalkenyl groups having 1 to 12 carbon atoms, aryl groups having 6 to 20 carbon atoms, or aralkyl or aryloxoalkyl groups having 7 to 12 carbon atoms, wherein some or all of hydrogen atoms of these groups may be substituted with alkoxy groups or the like; and wherein $R^{101b}$ and $R^{101c}$ may form a ring together with a sulfur atom to which they bond, and when a ring is formed, $R^{101b}$ and $R^{101c}$ each represent an alkylene group having 1 to 6 carbon atoms; and $K^{1-}$ and $K^{2-}$ represent a non-nucleophilic counter ion.

$R^{101a}$, $R^{101b}$, $R^{101c}$, $R^{101d}$, and $R^{101e}$ may be the same or different from one another, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups. Examples of the non-nucleophilic counter ions represented by $K^{1-}$ and $K^{2-}$ include: halide ions such as chloride ions and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

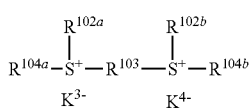
(P1b)

Wherein $R^{102a}$ and $R^{102b}$ each represent linear, branched or cyclic alkyl groups having 1 to 8 carbon atoms;

$R^{103}$ represents a linear, branched or cyclic alkylene group having 1 to 10 carbon atoms;

$R^{104a}$ and $R^{104b}$ each represent 2-oxoalkyl groups having 3 to 7 carbon atoms; and $K^{3-}$ and $K^{4-}$ each represent a non-nucleophilic counter ion.

Examples of $R^{102a}$ and $R^{102b}$ concretely include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Examples of $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Examples of $R^{104a}$ and $R^{104b}$ include 2-oxopropyl, 2-oxocyclopentyl, 2-oxocyclohexyl, and 2-oxocycloheptyl. Examples of $K^{3-}$ and $K^{4-}$ include the same ones as explained for the formulae (P1a-1), (P1a-2) and (P1a-3).

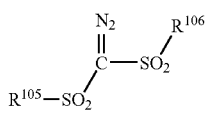
(P2)

wherein $R^{105}$ and $R^{106}$ represent linear, branched or cyclic alkyl or halogenated alkyl groups having 1 to 12 carbon atoms, substituted or unsubstituted aryl or halogenated aryl groups having 6 to 20 carbon atoms, or aralkyl groups having 7 to 12 carbon atoms.

Examples of alkyl groups represented by $R^{105}$ and $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl groups. Examples of halogenated alkyl groups include trifluoromethyl, 1,1,1-trifluoroethyl, 1,1,1-trichloroethyl, and nonafluorobutyl groups. Examples of aryl groups include a phenyl group; alkoxyphenyl groups such as p-methoxyphenyl, m-methoxyphenyl, o-methoxyphenyl, ethoxyphenyl, p-tert-butoxyphenyl, and m-tert-butoxyphenyl groups; and alkylphenyl groups such as 2-methylphenyl, 3-methylphenyl, 4-methylphenyl, ethylphenyl, 4-tert-butylphenyl, 4-butylphenyl, and dimethylphenyl groups. Examples of halogenated aryl groups include fluorophenyl, chlorophenyl, and 1,2,3,4,5-pentafluorophenyl groups. Examples of aralkyl groups include benzyl and phenethyl groups.

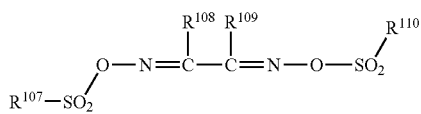
(P3)

wherein $R^{107}$, $R^{108}$, $R^{109}$, and $R^{110}$ represent linear, branched or cyclic alkyl or halogenated alkyl groups having 1 to 12 carbon atoms, aryl or halogenated aryl groups having 6 to 20 carbon atoms, or aralkyl groups having 7 to 12 carbon atoms;

wherein $R^{108}$ and $R^{109}$ each may form a ring together with carbon atoms to which they bond, respectively, and when a ring is formed, $R^{108}$ and $R^{109}$ each represent an alkylene group having 1 to 6 carbon atoms.

Examples of the alkyl, halogenated alkyl, aryl, halogenated aryl, and aralkyl groups represented by $R^{107}$, $R^{108}$, $R^{109}$, and $R^{110}$ are the same as those explained for $R^{105}$ and $R^{106}$. Note that examples of alkylene groups represented by $R^{108}$ and $R^{109}$ include methylene, ethylene, propylene, butylene, and hexylene groups.

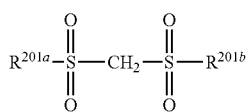
(P4)

wherein $R^{201a}$ and $R^{201b}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted with alkoxy groups or the like.

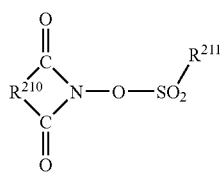
(P5)

wherein $R^{210}$ represents an arylene group having 6 to 10 carbon atoms, alkylene group having 1 to 6 carbon atoms, or alkenylene group having 2 to 6 carbon atoms wherein some or all of the hydrogen atoms included in these groups may be additionally substituted with linear or branched alkyl or alkoxy groups having 1 to 4 carbon atoms, nitro, acetyl, or phenyl groups;

$R^{211}$ represents a linear, branched, or substituted alkyl group having 1 to 8 carbon atoms, alkenyl, alkoxyalkyl, phenyl or naphthyl groups;

wherein some or all of the hydrogen atoms of these groups may be additionally substituted with: an alkyl or alkoxy group having 1 to 4 carbon atoms; a phenyl group which may be substituted with an alkyl or alkoxy group having 1 to 4 carbon atoms, nitro, or acetyl group; a hetero-aromatic group having 3 to 5 carbon atoms; or chlorine or fluorine atom.

For $R^{210}$, examples of the arylene group include 1,2-phenylene and 1,8-naphthylene; examples of the alkylene group include methylene, ethylene, trimethylene, tetramethylene, phenylethylene, and norbornane-2,3-diyl groups; and examples of the alkenylene group include 1,2-vinylene, 1-phenyl-1,2-vinylene, and 5-norbornene-2,3-diyl groups. For $R^{211}$, examples of the alkyl groups include: the same ones as those for $R^{101a}$ to $R^{101e}$; examples of the alkenyl group include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl groups; and examples of the alkoxyalkyl group include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl groups.

For the additional substitution groups, examples of the alkyl group having 1 to 4 carbon atoms include methyl, ethyl, propyl, isopropyl, n-butyl, isobutyl and tert-butyl; examples of the alkoxy group having 1 to 4 carbon atoms include methoxy, ethoxy, propoxy, isopropoxy, n-butoxy, isobutoxy, and tert-butoxy; examples of the phenyl group, which may be substituted with an alkyl or alkoxy group having 1 to 4 carbon atoms, nitro, or acetyl group, include phenyl, tolyl, p-tert-butoxyphenyl, p-acetylphenyl and p-nitrophenyl groups; and examples of the hetero-aromatic groups having 3 to 5 carbon atoms include pyridyl and furyl groups.

Concretely, examples of the above include photoacid generators listed below:

Onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

Diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfonic acid derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate; and sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene.

Sulfonate ester derivatives of N-hydroxyimide compounds, or the like, such as: N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxylmide methanesulfonate, N-hydroxy-5-norbornene-2,3-dicarboxylmide trifluoromethanesulfonate, and N-hydroxy-5-norbornene-2,3-dicarboxylmide p-toluenesulfonate.

Particularly preferably used among them are:

onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl (2-oxocylohexyl)sulfonium trifluoromethanesulfonate, and 1,2'-naphthylcarbonylmethyltetrahydrothiophenium triflate;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane; and sulfonate ester derivatives of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

The photoacid generators can be used solely in one kind or combinedly in two or more kinds. The addition amount of the photoacid generator is preferably 0.01 to 50 parts by mass, more preferably 0.05 to 40 parts by mass relative to 100 parts by mass of base polymer (i.e., the metal oxide-containing compound obtained by the above procedure).

Further, the metal oxide-containing film-forming composition can be improved in stability, by adding thereto, as a stabilizer, a monovalent or divalent or higher alcohol having a cyclic ether as a substitutional group, particularly ether compounds represented by the following formulae. Examples thereof include the following compounds:

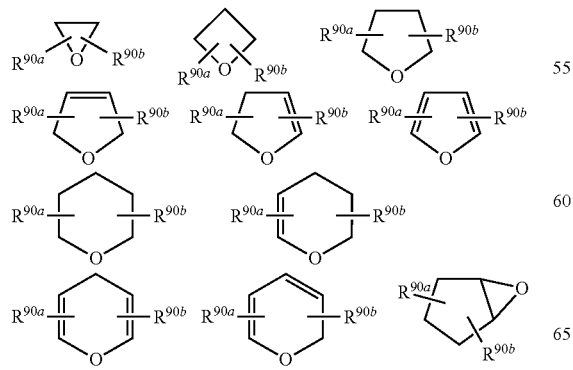

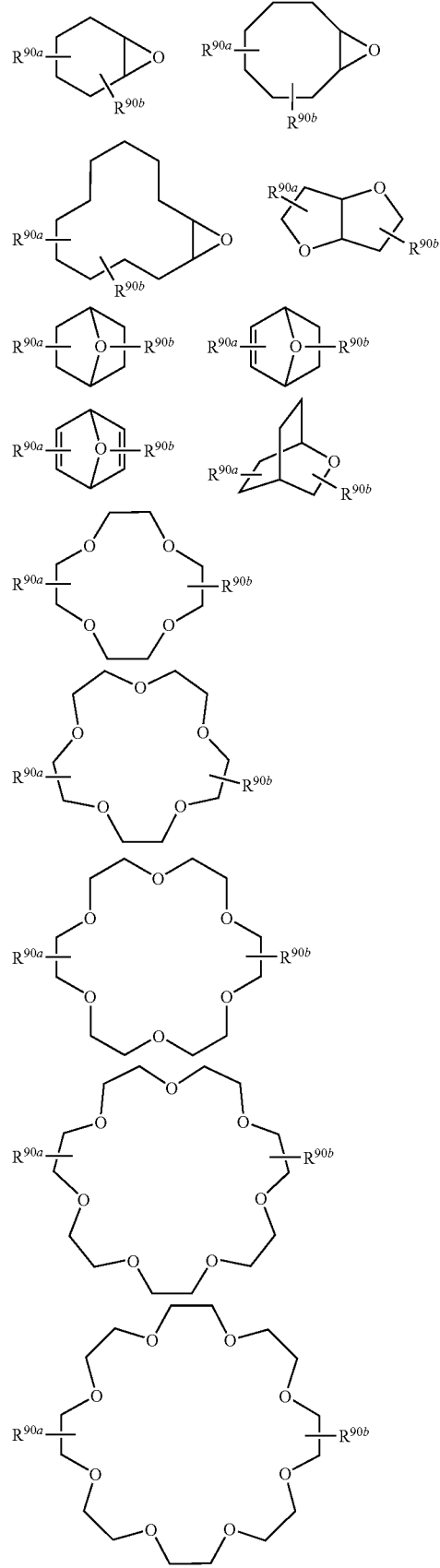

wherein $R^{90a}$ is: a hydrogen atom; a linear, branched or cyclic monovalent hydrocarbon group having 1 to 10 carbon atoms; $R^{91}O-(CH_2CH_2O)_{n1}-(CH_2)_{n2}-$ (where $0 \leq n1 \leq 5$, $0 \leq n2 \leq 3$, and $R^{91}$ is a hydrogen atom or methyl group); or $R^{92}O-[CH(CH_3)CH_2O]_{n3}-(CH_2)_{n4}-$ (where $0 \leq n3 \leq 5$, $0 \leq n4 \leq 3$, and $R^{92}$ is a hydrogen atom or methyl group); and $R^{90b}$ is: a hydroxyl group; a linear, branched or cyclic monovalent hydrocarbon group having 1 to 10 carbon atoms having one or two or more hydroxyl groups; $HO-(CH_2CH_2O)_{n5}-(CH_2)_{n6}-$ (where $1 \leq n5 \leq 5$, and $1 \leq n6 \leq 3$); or $HO-[CH(CH_3)CH_2O]_{n7}-(CH_2)_{n8}-$ (where $1 \leq n7 \leq 5$, and $1 \leq n8 \leq 3$).

Note that the stabilizers can be used solely in one kind, or combinedly in two or more kinds. The addition amount of the stabilizers is preferably 0.001 to 50 parts by mass, and more preferably 0.01 to 40 parts by mass, relative to 100 parts by mass of the base polymer (i.e., the metal oxide-containing compound of the component (A) obtained by the above procedure). Further, these stabilizers can be used solely in one kind, or mixedly in two or more kinds. Preferable structures among them are: crown ether derivatives; and compounds having, as a substitutional group, a bicyclo ring having an oxygen atom at its bridgehead site.

Addition of such a stabilizer further stabilizes an electric charge of acid, thereby contributing to stabilization of the silicon-containing compounds in the composition.

In the present invention, it is possible to blend a surfactant, as required. Here, the surfactant is preferably nonionic, and examples thereof include perfluoroalkyl polyoxyethylene ethanols, fluorinated alkyl esters, perfluoroalkylamine oxides, perfluoroalkyl ethylene oxide adducts, and fluorine containing organosiloxanes. Examples thereof include Fluorad "FC-430", "FC-431", and "FC-4430" (all produced by Sumitomo 3M Co., Ltd.), SURFLON "S-141", "S-145", "KH-10", "KH-20", "KH-30", and "KH-40" (all produced by ASAHI GLASS CO., LTD.), Unidain "DS-401", "DS-403", and "DS-451" (all produced by Daikin Industries Ltd.), MEGAFAC "F-8151" (produced by DAINIPPON INK AND CHEMICALS, INCORPORATED), and "X-70-092" and "X-70-093" (both produced by Shin-Etsu Chemical Co., Ltd.). Preferable examples include Fluorad "FC-4430", "KH-20", "KH-30", and "X-70-093".

Note that the addition amount of the surfactant may be a typical amount within such a range not to obstruct the effect of the present invention, and the addition amount is preferably 0 to 10 parts by mass, particularly 0 to 5 parts by mass relative to 100 parts by mass of the base polymer of the component (A).

The metal oxide-containing film of the present invention useful as an etching mask can be formed on a substrate from the metal oxide-containing film-forming composition by spin coating or the like, similarly to a photoresist film. After spin coating, the composition is desirably baked, so as to evaporate the solvent therein, and to promote crosslinking reaction for preventing the film from being mixed with the overlying photoresist film. Baking is to be preferably conducted within a temperature range of 50 to 500° C. and within a time range of 10 to 300 seconds. Particularly preferably, the temperature range is 400° C. or lower for decreased thermal damage against a device to be produced, depending on the structure thereof.

Here, it is possible in the present invention to form the metal oxide-containing film on a processing portion of a processing substrate by interposing an organic film as a resist lower layer film therebetween, and to form a photoresist film on the metal oxide-containing film, thereby conducting pattern formation.

In this case, examples of processing portions of a processing substrate include a low-dielectric constant insulating film having a k value of 3 or less, a primarily processed low-dielectric constant insulating film, a nitrogen and/or oxygen-containing inorganic film, and a metal film. Note that the lower layer film is preferably an organic film, and the resist composition for forming a photoresist film is preferably a chemically amplified resist composition without including silicon.

More specifically, the processing substrate may be a base substrate formed thereon with a processing layer (processing portion). The base substrate is not particularly limited, and may be made of a material such as Si, amorphous silicon (α-Si), p-Si, $SiO_2$, SiN, SiON, W, TiN, Al, and the like, which is different from that of a processing layer. Usable as processing layers are Si, $SiO_2$, SiN, SiON, p-Si, α-Si, W, W—Si, Al, Cu, Al—Si, etc., various low dielectric films, and etching stopper therefor, and each processing layer can be typically formed to have a thickness of 50 to 10,000 nm, particularly 100 to 5,000 nm.

In the present invention, it is possible to form a commercially available organic antireflective film between the metal oxide-containing film and the photoresist film. At this time, the organic antireflective film is made to have a structure of a compound having an aromatic substitutional group. Further, this organic antireflective film is required to impose no etching loads to an overlying photoresist film, upon transference of a pattern of the photoresist film by dry etching. For example, film thicknesses of 80% or less, preferably 50% or less relative to a photoresist film result in extremely small loads upon dry etching.

In this case, the organic antireflective film is preferably adjusted to exhibit a minimum reflectance of 2% or less, preferably 1% or less, and more preferably 0.5% or less.

When the metal oxide-containing film of the invention is used in an exposure process based on ArF excimer laser light, the overlying photoresist film may be any of typical resist compositions for ArF excimer laser light. Numerous candidates are known for a resist composition for ArF excimer laser light, such that each of them includes as main components: in case of a chemically amplified positive resist composition, a resin which is made soluble in an alkaline aqueous solution as a result of decomposition of acid labile groups by an action of an acid, a photoacid generator, and a basic substance for controlling acid diffusion; and in case of a chemically amplified negative resist composition, a resin which is made insoluble in an alkaline aqueous solution as a result of reaction with a crosslinker under the action of an acid, a photoacid generator, a crosslinker, and a basic substance for controlling acid diffusion; such that the characteristics of the resist compositions differ depending on what types of resins are used. Already known resins are generally classified into poly(meth)acrylic, COMA (cycloolefin maleic anhydride), COMA-(meth)acrylic hybrid, ROMP (ring-opening metathesis polymerization), and polynorbornene systems. Among them, the resist composition adopting a poly(meth)acrylic resin has an alicycle skeleton introduced into a side-chain to ensure an etching resistance, to exhibit a resolution performance superior to other resin systems.

While many are known as resist compositions adopting poly(meth)acrylic resins for ArF excimer laser, the polymer in any of positive compositions is constituted of: a combination of units for ensuring an etching resistance as a main function, units which are decomposed by an action of an acid and turned to be alkali soluble, and units for ensuring adhesion; or a combination including one unit capable of providing two or more of the above functions, as the case may be.

Particularly preferably used among them as the unit to be changed in alkali solubility by an acid, are (meth)acrylic acid esters having an acid labile group with an adamantane skeleton (Japanese Patent Laid-Open (kokai) No. H9-73173), and (meth)acrylic acid esters having an acid labile group with a norbornane or tetracyclododecane skeleton (Japanese Patent Laid-Open (kokai) No. 2003-84438), by virtue of higher resolution and etching resistance provided by them. Further, particularly preferably used as the units for ensuring adhesion, are (meth)acrylic acid esters having a norbornane side chain with a lactone ring (WO 00/01684), (meth)acrylic acid esters having an oxanorbornane side chain (Japanese Patent Laid-Open (kokai) No. 2000-159758), and (meth)acrylic acid esters having a hydroxyadamantyl side chain (Japanese Patent Laid-Open (kokai) No. H8-12626), by virtue of satisfactory etching resistance and higher resolution provided by them. However, it has become a problem that inclusion of fluorine in the polymer deteriorates an etching resistance. The metal oxide-containing film of the present invention can be particularly effectively used for the organic resist composition which is difficult to ensure an etching resistance as described above.

As a usage example of the metal oxide-containing film obtained from the metal oxide-containing film-forming composition of the present invention, there is created a photoresist film by a photoresist composition solution on a metal oxide-containing film after fabrication of the metal oxide-containing film, and spin coating is preferably adopted then, similarly to the metal oxide-containing film. After spin coating of the resist composition, prebaking is to be conducted, preferably in ranges of 80 to 180° C. and 10 to 300 seconds. Exposure is conducted then, followed by post-exposure bake (PEB) and development, to obtain a resist film pattern.

When the metal oxide-containing film of the present invention is used as an etching mask, etching is conducted by adopting a gas including a gas containing fluorine such as a flon based gas. The metal oxide-containing film of the present invention is characterized to exhibit a faster etching speed relative to the above gas, and thus to realize a smaller amount of film decrease of the overlying photoresist film.

In a multi-layer resist process adopting the metal oxide-containing film of the present invention, a resist lower layer film is provided between the metal oxide-containing film of the present invention and a processing substrate. Although the resist lower layer film is preferably an organic film having an aromatic skeleton when the resist lower layer film is used as an etching mask for the processing substrate, the resist lower layer film may be not only an organic film but also a silicon-containing material insofar as its silicon content is 15 mass % or less when the lower layer film is a sacrificial film.

When an organic film intended to act as an etching mask of a processing substrate is used as a resist lower layer film in the multi-layer resist process of the present invention, this organic film is configured to undergo a pattern transference after the pattern formed in the resist film is once transferred to the metal oxide-containing film, so that this organic film is required to have such characteristics: that the organic film can be etched under an etching condition, where the metal oxide-containing film exhibits a higher etching resistance; and that the organic film in turn exhibits a higher etching resistance against a condition for etching the processing substrate.

Such organic films as resist lower layer films have been numerously known as lower layer films for a three-layer resist process or for a bilayer resist process using a silicon resist composition, and many resins represented by novolak resins in addition to a 4,4'-(9H-fluoren-9-ylidene)bisphenol novolak resin (molecular weight of 11,000) described in Japanese Patent Laid-Open (kokai) No. 2005-128509 are known as resist lower layer film materials for the bilayer resist process and three-layer resist process, such that any of them are usable. Further, when it is intended to provide a heat resistance higher than a typical novolak, it is also possible to include a polycyclic skeleton such as 4,4'-(9H-fluoren-9-ylidene)bisphenol novolak resin, and to select a polyimide resin (Japanese Patent Laid-Open (kokai) No. 2004-153125, for example).

The organic film acting as the resist lower layer film can be formed on the substrate by using a composition solution in the same manner as the photoresist composition, such as by spin coating. After forming the organic film by spin coating or the like, it is desirable to bake it to evaporate an organic solvent therefrom. Baking is to be preferably conducted within a temperature range of 80 to 300° C. and within a time range of 10 to 300 seconds.

Note that the thickness of the organic film as the resist lower layer film is 10 nm or more, particularly preferably 50 nm or more to 50,000 nm or less without particularly limited thereto though the thickness varies depending on the etching condition; the thickness of the metal oxide-containing film of the present invention is to be 1 nm or more to 200 nm or less; and the thickness of a photoresist film to be formed on the metal oxide-containing film is preferably between 1 nm or more and 300 nm or less.

The three-layer resist process using the metal oxide-containing film of the present invention is configured as follows. In this process, an organic film is firstly created on a processing substrate, by spin coating or the like. The organic film is desirably high in etching resistance because the organic film acts as a mask upon etching of the processing substrate, and the organic film is to be desirably cross-linked by heat or acid after spin coating because the organic film is required not to be mixed with an overlying metal oxide-containing film. On the organic film, the metal oxide-containing film to be obtained from the composition of the present invention and a photoresist film are formed by the above-described procedures. According to a usual manner, the photoresist film is: pattern exposed by adopting a light source corresponding to the photoresist film such as KrF excimer laser light, ArF excimer laser light, $F_2$ laser light, or EUV light; heat-treated under the condition adapted to the individual photoresist film; and then subjected to a developing operation by a developer, to allow for obtainment of a resist film pattern. Next, etching is conducted for the metal oxide-containing film, by using this resist film pattern as an etching mask, and under a dry etching condition such as dry etching by a fluorine-based gas plasma where the etching speed of the metal oxide-containing film is significantly higher than that of the photoresist film. As a result, a metal oxide-containing film pattern can be obtained, substantially without undergoing an affection of a pattern change due to side etching of the photoresist film. Next, the substrate carrying the metal oxide-containing film pattern having the above obtained resist film pattern transferred thereto, is subjected to conduction of dry etching under a condition that the etching speed of the organic film as the resist lower layer film is significantly higher than that of the metal oxide-containing film, such as reactive dry etching by gas plasma containing oxygen, and reactive dry etching by gas plasma containing hydrogen-nitrogen, to thereby etch the underlying organic film. By this etching process, a pattern of the organic film is obtained, and simultaneously therewith, the resist layer as the uppermost layer is typically lost. Further, the thus obtained organic film pattern is used as an etching mask to conduct dry etching of the processing substrate such as fluorine-based dry etching, or chlorine-based dry etching, thereby enabling precise etching of the processing substrate. In the above example, it is possible to use an organic antireflective film on the metal oxide-containing film, as required.

EXAMPLE

Although the present invention will be concretely explained by describing Synthesis Examples, Examples, and Comparative Examples, the present invention is not limited by the description. Note that the symbol "%" in the Examples represents a mass %, and the molecular weight measurement was based on GPC.

Synthesis of Metal Oxide-Containing Compounds 1 to 6

Synthesis Example 1

Added into a mixture of 40 g of propylene glycol methyl ether, 1 g of methanesulfonic acid, and 50 g of deionized water, was a mixture of 10 g of phenyltrimethoxysilane, 20 g of 2-(3,4-epoxycyclohexyl)ethyltrimethoxysilane, 10 g of tetrabutoxy germanium, and 35 g of propylene glycol methyl ether; the resultant mixture was kept as it was for 12 hours at 40° C. to thereby subject it to hydrolytic condensation; and then by-product alcohols were distilledly removed therefrom under reduced pressure. Added to the resultant mixture were 800 ml of ethyl acetate and 300 ml of propylene glycol methyl ether, and a water layer was separated from the resultant mixture. Added to the remaining organic layer was 100 ml of ion exchange water, followed by stirring, still standing, and separation. This was repeated three times. Added to the remaining organic layer was 200 ml of propylene glycol methyl ether, followed by concentration thereof under reduced pressure, thereby obtaining 100 g of a propylene glycol methyl ether solution (polymer concentration of 20%) of a metal oxide-containing compound 1. The obtained solution was analyzed for methanesulfonic acid ion by ion chromatography, and such ions were not detected. The polymer was measured for a molecular weight, and determined to have Mw=3,000 relative to polystyrene standards.

Synthesis Example 2

Added into a mixture of 40 g of propylene glycol methyl ether, 1 g of methanesulfonic acid, and 50 g of deionized water, was a mixture of 10 g of phenyltrimethoxysilane, 20 g of 2-(3,4-epoxycyclohexyl)ethyltrimethoxysilane, 10 g of tetrabutoxy titanium, 20 g of 2,4-pentanedione, and 35 g of propylene glycol methyl ether; the resultant mixture was kept as it was for 12 hours at 30° C. to thereby subject it to hydrolytic condensation; and then by-product alcohols were distilledly removed therefrom under reduced pressure. Added to the remaining solution was 200 ml of propylene glycol methyl ether, followed by concentration thereof under reduced pressure, thereby obtaining 120 g of a propylene glycol methyl ether solution (polymer concentration of 20%) of a metal oxide-containing compound 2. The polymer was measured for a molecular weight, and determined to have Mw=8,000 relative to polystyrene standards.

Synthesis Example 3

Added into a mixture of 40 g of propylene glycol ethyl ether, 1 g of hydrochloric acid, and 50 g of deionized water, was a mixture of 10 g of phenyltrimethoxysilane, 20 g of 2-(3,4-epoxycyclohexyl)ethyltrimethoxysilane, 10 g of tetrapropoxy hafnium, and 35 g of propylene glycol ethyl ether; the resultant mixture was kept as it was for 12 hours at 10° C. to thereby subject it to hydrolytic condensation; and then by-product alcohols were distilledly removed therefrom under reduced pressure. Added to the remaining solution was 200 ml of propylene glycol ethyl ether, followed by concentration thereof under reduced pressure, thereby obtaining 100 g of a propylene glycol ethyl ether solution (polymer concentration of 20%) of a metal oxide-containing compound 3. The polymer was measured for a molecular weight, and determined to have Mw=5,000 relative to polystyrene standards.

Synthesis Example 4

Added into a mixture of 260 g of ion exchange water and 1 g of 35% hydrochloric acid, was a mixture of 70 g of tetramethoxysilane, 25 g of methyltrimethoxysilane, 25 g of silane compound represented by the following formula [i], 10 g of trimethoxy aluminum, and 10 g of phenyltrimethoxysilane, at a room temperature. The resultant mixture was kept as it was for 8 hours at the room temperature to thereby subject it to hydrolytic condensation; and then by-product methanol were distilledly removed therefrom under reduced pressure. Added to the resultant mixture were 800 ml of ethyl acetate and 300 ml of propylene glycol propyl ether, and a water layer was separated from the resultant mixture. Added to the remaining organic layer was 100 ml of ion exchange water, followed by stirring, still standing, and separation. This was repeated three times. Added to the remaining organic layer was 200 ml of propylene glycol monopropyl ether, followed by concentration thereof under reduced pressure, thereby obtaining 300 g of a propylene glycol monopropyl ether solution (polymer concentration of 20%) of a metal oxide-containing compound 4. The obtained solution was analyzed for chloro ion by ion chromatography, and such ions were not detected. The polymer was measured for a molecular weight, and determined to have Mw=2,500 relative to polystyrene standards.

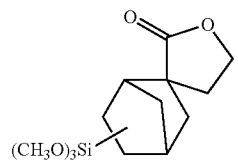

[i]

Synthesis Example 5

Added into a mixture of 200 g of ethanol, 100 g of ion exchange water, and 3 g of methanesulfonic acid, was a mixture of 40 g of tetramethoxysilane, 10 g of methyltrimethoxysilane, 50 g of trimethyl borate, and 10 g of phenyltrimethoxysilane, at a room temperature. The resultant mixture was kept as it was for 8 hours at the room temperature to thereby subject it to hydrolytic condensation; and then by-product methanol were distilledly removed therefrom under reduced pressure. Added to the resultant mixture were 800 ml of ethyl acetate and 300 ml of ethylene glycol monopropyl ether, and a water layer was separated from the resultant mixture. Added to the remaining organic layer was 100 ml of ion exchange water, followed by stirring, still standing, and separation. This was repeated three times. Added to the remaining organic layer was 200 ml of ethylene glycol monopropyl ether, followed by concentration thereof under reduced pressure, thereby obtaining 300 g of an ethylene glycol monopropyl ether solution (polymer concentration of 20%) of a metal oxide-containing compound 5. The obtained solution was analyzed for methanesulfonic acid ion by ion chromatography, and it was revealed that 99% of such ions used for the reaction were removed. The polymer was measured for a molecular weight, and determined to have Mw=2,100 relative to polystyrene standards.

Synthesis Example 6

Added into a mixture of 200 g of ethanol, 100 g of ion exchange water, and 3 g of methanesulfonic acid, was a mixture of 40 g of tetramethoxysilane, 10 g of methyltrimethoxysilane, 20 g of 2-(3,4-epoxycyclohexyl)ethyltrimethoxysilane, and 10 g of phenyltrimethoxysilane, at a room temperature. The resultant mixture was kept as it was for 8 hours at the room temperature to thereby subject it to hydrolytic condensation; and then by-product methanol were distilledly removed therefrom under reduced pressure. Added to the resultant mixture were 800 ml of ethyl acetate and 300 ml of ethylene glycol monopropyl ether, and a water layer was separated from the resultant mixture. Added to the remaining organic layer was 100 ml of ion exchange water, followed by stirring, still standing, and separation. This was repeated three times. Added to the remaining organic layer was 200 ml of ethylene glycol monopropyl ether, followed by concentration thereof under reduced pressure, thereby obtaining 300 g of an ethylene glycol monopropyl ether solution (polymer concentration of 20%) of a metal oxide-containing compound 6. The obtained solution was analyzed for methanesulfonic acid ion by ion chromatography, and it was revealed that 99% of such ions used for the reaction were removed. The polymer was measured for a molecular weight, and determined to have Mw=3,500 relative to polystyrene standards.

Synthesis of Silicon-Containing Compounds 7 and 8

Synthesis Example 7

Charged into a 1,000 ml glass flask were 500 g of ethanol, 250 g of ion exchange water, and 2.5 g of 25% tetramethylammonium hydroxide, this mixture was kept stirred at 55° C. to drop a mixed liquid of 97 g of tetraethoxysilane and 73 g of methyltrimethoxysilane into the mixture over a period of 2 hours. After stirring at 55° C. for 1 hour, the resultant mixture was cooled down to a room temperature, followed by addition of 3 g of 20% aqueous maleic acid solution thereto. Further added into the solution was 1,000 ml of propylene glycol monopropyl ether, followed by concentration of the resultant solution down to 900 ml. Subsequently, 2,000 ml of ethyl acetate was added to the concentrated solution, the resultant mixture was washed twice by 300 ml of ion exchange water and then subjected to separation, and the ethyl acetate in the separated solution was concentrated under reduced pressure, to obtain 900 g of propylene glycol monopropyl ether (polymer concentration of 7%) of a silicon-containing compound 7. The polymer was measured for a molecular weight, and determined to have Mw=about 100,000 relative to polystyrene standards.

Synthesis Example 8

Charged into a 1,000 ml glass flask were 260 g of ion exchange water and 5 g of 65% nitric acid; and a mixture of 70 g of tetraethoxysilane, 70 g of methyltrimethoxysilane, and 10 g of phenyltrimethoxysilane was added into the resultant solution at a room temperature. The resultant mixture was kept as it was for 8 hours at the room temperature to thereby subject it to hydrolytic condensation; and then methanol and by-product alcohols were distilledly removed therefrom under reduced pressure. Added to the resultant mixture were 800 ml of ethyl acetate and 300 ml of propylene glycol monopropyl ether, and a water layer was separated from the resultant mixture. Added to the remaining organic layer was 100 ml of 1% aqueous maleic acid solution, followed by stirring, still standing, and separation. This was repeated twice, and then 100 ml of ion exchange water was added, followed by stirring, still standing, and separation. This was repeated three times. Added to the remaining organic layer was 200 ml of propylene glycol monopropyl ether, followed by concentration thereof under reduced pressure, thereby obtaining 300 g of a propylene glycol monopropyl ether solution (polymer concentration of 21%) of a silicon-containing compound 8. The polymer was measured for a molecular weight, and determined to have Mw=2,000 relative to polystyrene standards.

Examples 1 to 15, and Comparative Examples 1 to 3

(A) The metal oxide-containing compounds 1 to 6 obtained in the Synthesis Examples, (C) a monovalent, divalent, or higher organic acid having 1 to 30 carbon atoms, (B) a thermal crosslinking accelerator, (E) an organic solvent, (D) a trivalent or higher alcohol as a crosslinking agent, the silicon-containing compounds 7 and 8, water, and other additives were mixed with one another at ratios listed in Table 1, respectively, followed by filtration by a filter made of fluororesin of a 0.1 μm size, to prepare metal oxide-containing film-forming composition solutions named Sol. 1 to 18, respectively.

TABLE 1

| | No. | Metal oxide-containing compound, Silicon-containing compound (parts by mass) | Thermal crosslinking accelerator (parts by mass) | Organic acid (parts by mass) | Organic solvent (parts by mass) | Cross linking agent (parts by mass) | water (parts by mass) | Other Additive (parts by mass) |
|---|---|---|---|---|---|---|---|---|
| EXP 1 | Sol. 1 | Compound 1 (4.0) | TPSOAc (0.04) | maleic acid (0.04) | propylene glycol methyl ether (100) | Crosslinking agent 1 (5) | Water (0) | none |
| EXP 2 | Sol. 2 | Compound 1 (4.0) | TPSOH (0.04) | oxalic acid (0.04) | propylene glycol methyl ether (100) | Crosslinking agent 2 (5) | Water (10) | none |

TABLE 1-continued

| No. | Metal xide-ontaining compound, Silicon-containing compound (parts by mass) | Thermal crosslinking accelerator (parts by mass) | Organic acid (parts by mass) | Organic solvent (parts by mass) | Cross linking agent (parts by mass) | water (parts by mass) | Other Additive (parts by mass) |
|---|---|---|---|---|---|---|---|
| EXP 3 | Sol. 3 | Compound 1 (4.0) | TPSCl (0.04) TPSOAc (0.003) | maleic acid (0.04) | propylene glycol methyl ether (100) | Crosslinking agent 3 (5) | Water (10) | TPSNf (0.02) |
| EXP 4 | Sol. 4 | Compound 1 (4.0) | TPSMA (0.04) TMAOAc (0.003) | maleic acid (0.04) oxalic acid (0.04) | propylene glycol methyl ether (100) | Crosslinking agent 4 (5) | Water (10) | none |
| EXP 5 | Sol. 5 | Compound 1 (4.0) Compound 7 (0.4) | TPSN (0.04) | maleic acid (0.04) oxalic acid (0.04) | propylene glycol methyl ether (100) | Crosslinking agent 5 (5) | Water (10) | none |
| EXP 6 | Sol. 6 | Compound 1 (4.0) Compound 8 (0.4) | TPSMA (0.04) | maleic acid (0.04) | propylene glycol methyl ether (100) | Crosslinking agent 1 (5) | Water (10) | none |
| EXP 7 | Sol. 7 | Compound 1 (3.2) Compound 7 (0.4) Compound 8 (0.4) | TPSOAc (0.04) | fumaric acid (0.04) | propylene glycol methyl ether (100) | Crosslinking agent 1 (5) | Water (10) | none |
| EXP 8 | Sol. 8 | Compound 2 (4.0) | TPSOAc (0.04) | maleic acid (0.04) | propylene glycol methyl ether (100) | Crosslinking agent 1 (5) | Water (10) | none |
| EXP 9 | Sol. 9 | Compound 2 (4.0) | TPSMA (0.04) | maleic acid (0.04) | propylene glycol methyl ether (100) | Crosslinking agent 1 (5) | Water (10) | none |
| EXP 10 | Sol. 10 | Compound 3 (4.0) | TPSOAc (0.04) | maleic acid (0.04) | propylene glycol ethyl ether (100) | Crosslinking agent 1 (5) | Water (10) | none |
| EXP 11 | Sol. 11 | Compound 3 (4.0) | TPSOH (0.04) | maleic acid (0.04) | propylene glycol ethyl ether (100) | Crosslinking agent 1 (5) | Water (10) | none |
| EXP 12 | Sol. 12 | Compound 4 (4.0) | TPSMA (0.04) | maleic acid (0.04) | propylene glycol propyl ether (100) | Crosslinking agent 1 (5) | Water (10) | none |
| EXP 13 | Sol. 13 | Compound 4 (4.0) | TPSOAc (0.04) | maleic acid (0.04) | propylene glycol propyl ether (100) | Crosslinking agent 1 (5) | Water (10) | none |
| EXP 14 | Sol. 14 | Compound 5 (4.0) | TPSMA (0.04) | maleic acid (0.04) | propylene glycol propyl ether (100) | Crosslinking agent 1 (5) | Water (10) | none |
| EXP 15 | Sol. 15 | Compound 5 (4.0) | TPSN (0.04) | maleic acid (0.04) | propylene glycol propyl ether (100) | Crosslinking agent 1 (5) | Water (10) | none |
| COM. EX. 1 | Sol. 16 | Compound 6 (4.0) | TPSMA (0.04) | maleic acid (0.04) | propylene glycol propyl ether (100) | none | Water (10) | none |
| COM. EX. 2 | Sol. 17 | Compound 1 (4.0) | none | maleic acid (0.04) | propylene glycol propyl ether (100) | Crosslinking agent 1 (5) | Water (10) | none |
| COM. EX. 3 | Sol. 18 | Compound 1 (4.0) | TPSMA (0.04) | none | propylene glycol propyl ether (100) | Crosslinking agent 1 (5) | Water (10) | none |

The thermal crosslinking accelerator (B), the trivalent or higher alcohol (D) as a crosslinking agent, the photoacid generators used in Examples 1 to 15 and Comparative Examples 1 to 3 are listed as follows:

TPSOAC: triphenylsulfonium acetate (photo-degradable thermal crosslinking accelerator)

TPSOH: triphenylsulfonium hydroxide (photo-degradable thermal crosslinking accelerator)

TPSCl: triphenylsulfonium chloride (photo-degradable thermal crosslinking accelerator)

TPSMA: mono(triphenylsulfonium) maleate (photo-degradable thermal crosslinking accelerator)

TPSN: triphenylsulfonium nitrate (photo-degradable thermal crosslinking accelerator)

TMAOAc: tetramethylammonium acetate (non-photo-degradable thermal crosslinking accelerator)

TPSNf: triphenylsulfonium nonafluorobutanesulfonate (photoacid generator)

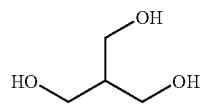

CROSSLINKING AGENT 1

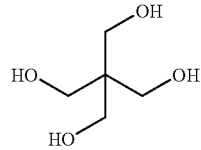

CROSSLINKING AGENT 2

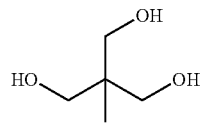

CROSSLINKING AGENT 3

-continued

CROSSLINKING AGENT 4

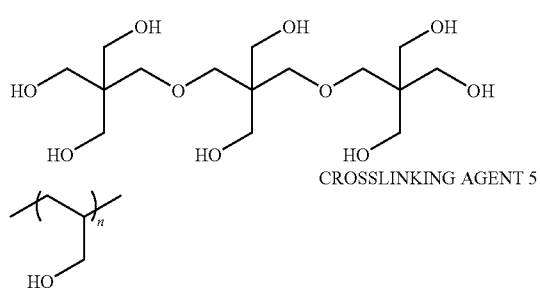

CROSSLINKING AGENT 5

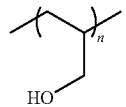

Firstly, a composition (28 parts by mass of resin, and 100 parts by mass of solvent (PGMEA)) containing a 4,4'-(9H-fluoren-9-ylidene)bisphenol novolak resin (molecular weight of 11,000) (Japanese Patent Laid-Open (kokai) No. 2005-128509) as an organic film material to be used as a resist lower layer film, was spin coated onto an Si wafer, followed by heating at 200° C. for one minute for film formation, to form an organic film as a resist lower layer film having a thickness of 300 nm. As such an organic film material as a lower layer film material for a multi-layer resist process, many resins represented by for example novolak resins including the above one are known, and any of them are usable.

Next, Sol. 1 to 18 were spin coated, followed by heating at 200° C. for one minute for film formation, to form a metal oxide-containing film having a thickness of 100 nm.

Further, in order to form a photoresist film as a resist upper layer film on metal oxide-containing film, a resist composition for ArF excimer laser light exposure was prepared by dissolving the components listed just below, in a PGMEA (propylene glycol monoethyl ether acetate) solution containing 0.1% FC-430 (made by Sumitomo 3M Co., Ltd.), followed by filtration by a filter made of fluororesin of a 0.1 μm size.

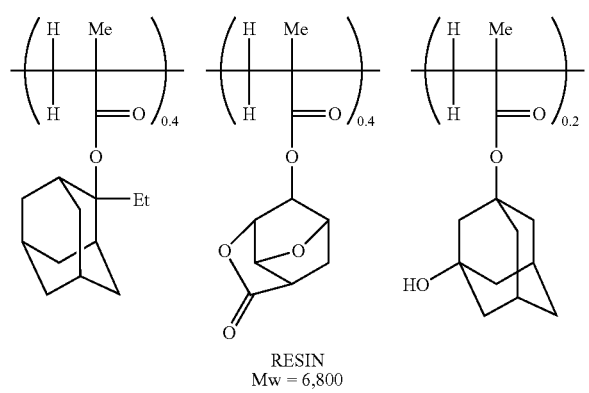

RESIN
Mw = 6,800

(Me Represents a Methyl Group, and Et Represents an Ethyl Group)

10 parts by mass

Photoacid generator: triphenylsulfonium nonafluorobutanesulfonate 0.2 parts by mass Basic compound: triethanolamine 0.02 parts by mass This composition was coated on metal oxide-containing film, and baked at 130° C. for 60 seconds, to form a photoresist film as a resist upper layer film having a thickness of 200 nm.

Next, exposure was conducted by an ArF exposure system (S305B, NA=0.68, σ0.85, ⅔ annular illumination, Cr mask, manufactured by Nikon Corp.), followed by baking (PEB) at 110° C. for 90 seconds, and by development by an aqueous solution of 2.38% tetramethylammonium hydroxide (TMAH), thereby obtaining a positive resist film pattern. Table 2 shows observation results of pattern profiles of the obtained 90 nm l/S patterns.

TABLE 2

| | No. | Pattern profile |
|---|---|---|
| Example 1 | Sol. 1 | Excellent |
| Example 2 | Sol. 2 | Excellent |
| Example 3 | Sol. 3 | Excellent |
| Example 4 | Sol. 4 | Excellent |
| Example 5 | Sol. 5 | Excellent |
| Example 6 | Sol. 6 | Excellent |
| Example 7 | Sol. 7 | Excellent |
| Example 8 | Sol. 8 | Excellent |
| Example 9 | Sol. 9 | Excellent |
| Example 10 | Sol. 10 | Excellent |
| Example 11 | Sol. 11 | Excellent |
| Example 12 | Sol. 12 | Excellent |
| Example 13 | Sol. 13 | Excellent |
| Example 14 | Sol. 14 | Excellent |
| Example 15 | Sol. 15 | Excellent |
| Comparative Example 1 | Sol. 16 | Excellent |
| Comparative Example 2 | Sol. 17 | Pattern collapse |
| Comparative Example 3 | Sol. 18 | Excellent |

In all Examples, such patterns were obtained which were free of footing, undercut, and intermixing phenomena near a substrate. In Comparative Example 2, pattern collapse was caused.

(Dry Etching Resistance Test)

Conducted next was a test for dry etching resistance. The compositions Sol. 1 to 18 were spin coated, and heated at 200° C. for one minute for film formation, to create metal oxide-containing films Film 1 to 18 having a thickness of 100 nm. Etching test was then conducted under the following etching condition (1), for these films, the underlying organic film and the overlying photoresist film. The results are listed in Table 3. The metal oxide-containing films of all Examples were sufficiently fast in etching speed as compared with the organic film and photoresist film, thereby enabling to conduct pattern transference into metal oxide-containing film by utilizing the associated resist film pattern as an etching mask. All Examples exhibited no etching speed differences even when compared with Comparative Example 1 without including a crosslinking agent, thereby showing that addition of a crosslinking agent did not affect an etching speed.

(1) Etching Test by $CHF_3/CF_4$-based Gas

Apparatus: Dry etching apparatus TE-8500P manufactured by Tokyo Electron Limited Etching Condition (1):

Chamber pressure: 40.0 Pa

RF power: 1,300W

Gap: 9 mm $CHF_3$ gas flow rate: 30 ml/min $CF_4$ gas flow rate: 30 ml/min

Ar gas flow rate: 100 ml/min

Treating time: 10 sec

TABLE 3

| | Metal oxide-containing film-forming composition | Metal oxide-containing film | Dry etching speed (nm/min) by CHF$_3$/CF$_4$-based gas |
|---|---|---|---|
| Example 1 | Sol. 1 | Film 1 | 450 |
| Example 2 | Sol. 2 | Film 2 | 450 |
| Example 3 | Sol. 3 | Film 3 | 450 |
| Example 4 | Sol. 4 | Film 4 | 450 |
| Example 5 | Sol. 5 | Film 5 | 450 |
| Example 6 | Sol. 6 | Film 6 | 450 |
| Example 7 | Sol. 7 | Film 7 | 450 |
| Example 8 | Sol. 8 | Film 8 | 410 |
| Example 9 | Sol. 9 | Film 9 | 410 |
| Example 10 | Sol. 10 | Film 10 | 420 |
| Example 11 | Sol. 11 | Film 11 | 420 |
| Example 12 | Sol. 12 | Film 12 | 410 |
| Example 13 | Sol. 13 | Film 13 | 410 |
| Example 14 | Sol. 14 | Film 14 | 420 |
| Example 15 | Sol. 15 | Film 15 | 420 |
| Comparative Example 1 | Sol. 16 | Film 16 | 450 |
| Comparative Example 2 | Sol. 17 | Film 17 | 450 |
| Comparative Example 3 | Sol. 18 | Film 18 | 450 |
| Photoresist film | — | — | 120 |
| Organic film | — | — | 90 |

Next, dry etching speeds were tested by O$_2$-based gas under the following etching condition (2), with the results listed in Table 4. The metal oxide-containing films of all Examples were sufficiently slow in etching speed as compared with the organic film and photoresist film, thereby enabling to conduct pattern transference into organic film acting as a resist lower layer film by utilizing the metal oxide-containing film pattern as an etching mask.

Etching Condition (2):
Chamber pressure: 60.0 Pa
RF power: 600W
Ar gas flow rate: 40 ml/min
O$_2$ gas flow rate: 60 ml/min
Gap: 9 mm
Treating time: 20 sec

TABLE 4

| | Metal oxide-containing film | Dry etching speed (nm/min) by O$_2$-based gas |
|---|---|---|
| Example 1 | Film 1 | 2 |
| Example 2 | Film 2 | 2 |
| Example 3 | Film 3 | 2 |
| Example 4 | Film 4 | 2 |
| Example 5 | Film 5 | 1 |
| Example 6 | Film 6 | 2 |
| Example 7 | Film 7 | 2 |
| Example 8 | Film 8 | 1 |
| Example 9 | Film 9 | 3 |
| Example 10 | Film 10 | 3 |
| Example 11 | Film 11 | 4 |
| Example 12 | Film 12 | 4 |
| Example 13 | Film 13 | 3 |
| Example 14 | Film 14 | 3 |
| Example 15 | Film 15 | 2 |
| Comparative Example 1 | Film 16 | 3 |
| Comparative Example 2 | Film 17 | 10 |
| Comparative Example 3 | Film 18 | 2 |
| Photoresist film | — | 250 |
| Organic film | — | 210 |

Further, a delamination test was conducted. Namely, the metal oxide-containing films formed of the above obtained metal oxide-containing film compositions (Sol. 1 to 18) were treated at 90° C. in a sulfuric acid/hydrogen peroxide mixture comprising sulfuric acid and aqueous hydrogen peroxide mixed at a ratio of 3:1, thereby confirming a delamination capability.

TABLE 5

| | Metal oxide-containing film-forming composition | State after delamination |
|---|---|---|
| Example 1 | Sol. 1 | No residue of coated film on wafer |
| Example 2 | Sol. 2 | No residue of coated film on wafer |
| Example 3 | Sol. 3 | No residue of coated film on wafer |
| Example 4 | Sol. 4 | No residue of coated film on wafer |
| Example 5 | Sol. 5 | No residue of coated film on wafer |
| Example 6 | Sol. 6 | No residue of coated film on wafer |
| Example 7 | Sol. 7 | No residue of coated film on wafer |
| Example 8 | Sol. 8 | No residue of coated film on wafer |
| Example 9 | Sol. 9 | No residue of coated film on wafer |
| Example 10 | Sol. 10 | No residue of coated film on wafer |
| Example 11 | Sol. 11 | No residue of coated film on wafer |
| Example 12 | Sol. 12 | No residue of coated film on wafer |
| Example 13 | Sol. 13 | No residue of coated film on wafer |
| Example 14 | Sol. 14 | No residue of coated film on wafer |
| Example 15 | Sol. 15 | No residue of coated film on wafer |
| Comparative Example 1 | Sol. 16 | Could not be delaminated |
| Comparative Example 2 | Sol. 17 | No residue of coated film on wafer |
| Comparative Example 3 | Sol. 18 | No residue of coated film on wafer |

From the results listed in Table 5, delamination of the metal oxide-containing films was possible in all Examples by a sulfuric acid-hydrogen peroxide-water mixture, insofar as the compositions for providing the films included a trivalent or higher alcohol as a crosslinking agent. In turn, the metal oxide-containing film of Comparative Example 1 without including a crosslinking agent was not allowed to be delaminated.

Further, a storage stability test was conducted. Namely, the above obtained metal oxide-containing film compositions (Sol. 1 to 18) were stored at 30° C. for 3 months, and thereafter coating was again conducted by the above-described procedure, to thereby conduct a test as to whether a change in film-forming ability was caused or not. The results are listed in Table 6.

TABLE 6

| | Metal oxide-containing film-forming composition | Stability test result |
|---|---|---|
| Example 1 | Sol. 1 | No film thickness change, and no pattern profile change |
| Example 2 | Sol. 2 | No film thickness change, and no pattern profile change |
| Example 3 | Sol. 3 | No film thickness change, and no pattern profile change |
| Example 4 | Sol. 4 | No film thickness change, and no pattern profile change |
| Example 5 | Sol. 5 | No film thickness change, and no pattern profile change |
| Example 6 | Sol. 6 | No film thickness change, and no pattern profile change |
| Example 7 | Sol. 7 | No film thickness change, and no pattern profile change |
| Example 8 | Sol. 8 | No film thickness change, and no pattern profile change |
| Example 9 | Sol. 9 | No film thickness change, and no pattern profile change |
| Example 10 | Sol. 10 | No film thickness change, and no pattern profile change |
| Example 11 | Sol. 11 | No film thickness change, and no pattern profile change |
| Example 12 | Sol. 12 | No film thickness change, and no pattern profile change |
| Example 13 | Sol. 13 | No film thickness change, and no pattern profile change |
| Example 14 | Sol. 14 | No film thickness change, and no pattern profile change |
| Example 15 | Sol. 15 | No film thickness change, and no pattern profile change |
| Comparative Example 1 | Sol. 16 | No film thickness change, and no pattern profile change |
| Comparative Example 2 | Sol. 17 | 15% increase of film thickness, stripped pattern profile |
| Comparative Example 3 | Sol. 18 | 5% increase of film thickness, stripped pattern profile |

From the results listed in Table 6, it was confirmed that the metal oxide-containing film-forming compositions in all Examples possessed a storage stability at 30° C. for 3 months or longer, or for 6 months or longer when evaluated at a room temperature. In turn, Comparative Example 2 and Comparative Example 3 were increased in film thickness, and stripping was caused in pattern profile.

Based on the above, it was confirmed that adoption of the thermosetting metal oxide-containing film-forming composition of the present invention allows for obtainment of a metal oxide-containing film such that: the film made of the composition allows for formation of an excellent resist film pattern even by usage of a high-NA exposure system; the film made of the composition is capable of exhibiting a sufficient etching selectivity ratio relative to an underlying organic film as a dry etching mask and relative to an overlying photoresist film; the composition is excellent in storage stability; and the film made of the composition is capable of wet delamination by a delamination solution.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:
1. A thermosetting metal oxide-containing film-forming composition for forming a metal oxide-containing film to be formed in a multilayer resist process used in lithography, the thermosetting metal oxide-containing film-forming composition comprising, at least:
(A) a metal oxide-containing hydrolysis-condensation product of: one kind or two or more kinds of hydrolyzable silicon compounds represented by the following general formula (1); and one kind or two or more kinds of hydrolyzable metal compounds represented by the following general formula (2):

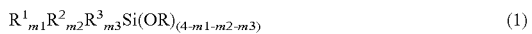

$$R^1{}_{m1}R^2{}_{m2}R^3{}_{m3}Si(OR)_{(4-m1-m2-m3)} \qquad (1)$$

wherein R is an alkyl group having 1 to 6 carbon atoms; $R^1$, $R^2$, and $R^3$ are each a hydrogen atom or a monovalent organic group having 1 to 30 carbon atoms; m1, m2, and m3 are 0 or 1; and m1+m2+m3 is an integer from 0 to 3

$$U(OR^4)_{m4}(OR^5)_{m5} \qquad (2)$$

wherein $R^4$ and $R^5$ are an organic group having 1 to 30 carbon atoms;
m4+m5 is a valence to be determined by a kind of U;
m4 and m5 are an integer of 0 or more; and
U is an element belonging to group III, group IV or group V in the periodic table, except for silicon and carbon;
(B) one kind or two or more kinds of thermal crosslinking accelerators represented by the following general formula (3) or (4):

$$L_a H_b X \qquad (3)$$

wherein L is lithium, sodium, potassium, rubidium, or cesium;
X is a hydroxyl group, or a monovalent, divalent or higher organic acid group having 1 to 30 carbon atoms;
a is an integer of 1 or more;
b is an integer of 0 or 1 or more; and
a+b is a valence of the hydroxyl group or organic acid group

$$M_{a'} H_{b'} A \qquad (4)$$

wherein M is sulfonium, iodonium, or ammonium;
A is a hydroxyl group, a monovalent, divalent, or higher organic acid group having 1 to 30 carbon atoms, or a non-nucleophilic counter ion;
a' is an integer of 1 or more;
b' is an integer of 0 or 1 or more; and
a'+b' is a valence of the hydroxyl group, organic acid group, or non-nucleophilic counter ion;
(C) a monovalent, divalent, or higher organic acid having 1 to 30 carbon atoms;
(D) a trivalent or higher alcohol selected from following formulae:

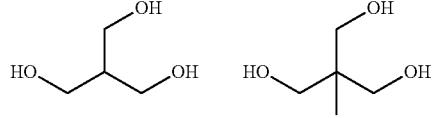

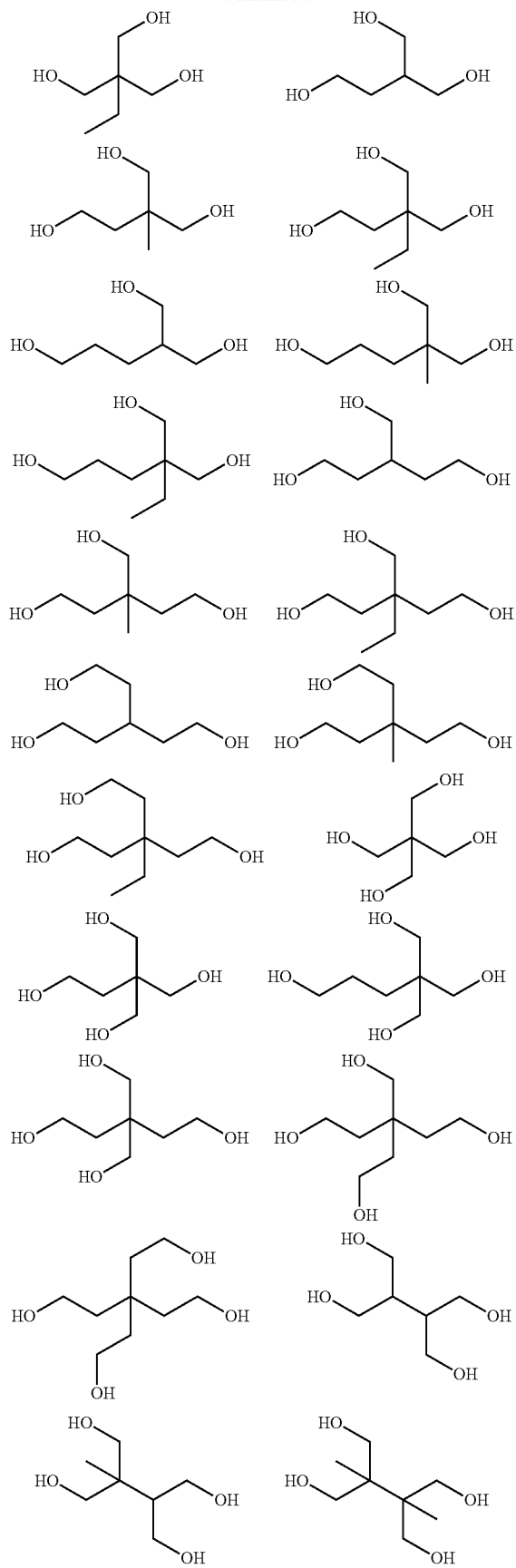
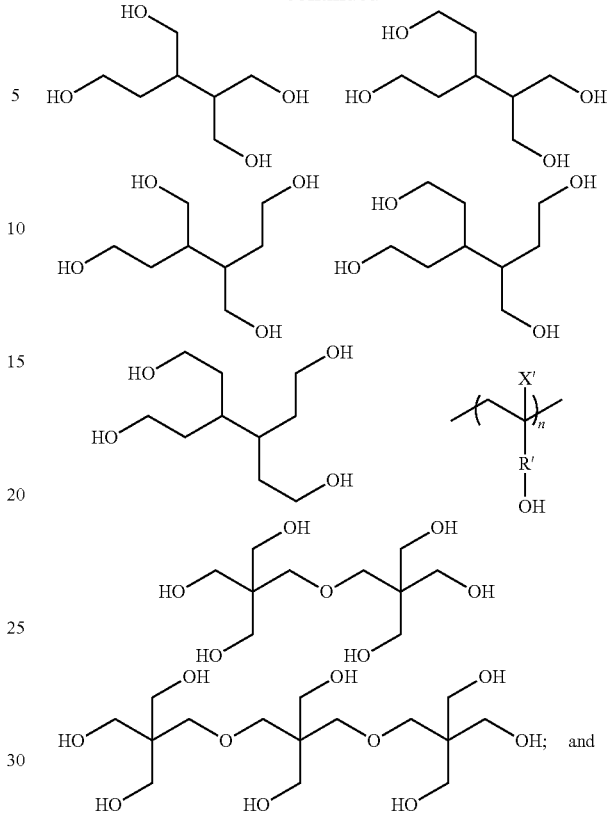

(E) an organic solvent.

2. The thermosetting metal oxide-containing film-forming composition according to claim 1, wherein the thermosetting metal oxide-containing film-forming composition further comprises a silicon-containing hydrolysis-condensation product of one kind or two or more kinds of hydrolyzable silicon compounds represented by the following general formula (5):

$$R^6{}_{m6}R^7{}_{m7}R^8{}_{m8}Si(OR^9)_{(4-m6-m7-m8)} \qquad (5)$$

wherein $R^9$ is an alkyl group having 1 to 6 carbon atoms;
$R^6$, $R^7$, and $R^8$ are each a hydrogen atom, or a monovalent organic group having 1 to 30 carbon atoms;
m6, m7, and m8 are 0 or 1; and
m6+m7+m8 is an integer from 0 to 3.

3. The thermosetting metal oxide-containing film-forming composition according to claim 1, wherein M in the above general formula (4) is a tertiary sulfonium, secondary iodonium, or quaternary ammonium.

4. The thermosetting metal oxide-containing film-forming composition according to claim 1, wherein the thermosetting metal oxide-containing film-forming composition comprises the metal oxide-containing hydrolysis-condensation product having a light-absorbing group.

5. The thermosetting metal oxide-containing film-forming composition according to claim 3, wherein the thermosetting metal oxide-containing film-forming composition comprises the metal oxide-containing hydrolysis-condensation product having a light-absorbing group.

6. The thermosetting metal oxide-containing film-forming composition according to claim 1, wherein M in the above general formula (4) is photo-degradable.

7. The thermosetting metal oxide-containing film-forming composition according to claim 5, wherein M in the above general formula (4) is photo-degradable.

8. The thermosetting metal oxide-containing film-forming composition according to claim 1, wherein the thermosetting metal oxide-containing film-forming composition further comprises water.

9. The thermosetting metal oxide-containing film-forming composition according to claim 7, wherein the thermosetting metal oxide-containing film-forming composition further comprises water.

10. The thermosetting metal oxide-containing film-forming composition according to claim 1, wherein the thermosetting metal oxide-containing film-forming composition further comprises a photoacid generator.

11. The thermosetting metal oxide-containing film-forming composition according to claim 9, wherein the thermosetting metal oxide-containing film-forming composition further comprises a photoacid generator.

12. The thermosetting metal oxide-containing film-forming composition according to claim 1, wherein the thermosetting metal oxide-containing film-forming composition further comprises a monovalent or divalent or higher alcohol having a cyclic ether as a substitutional group.

13. The thermosetting metal oxide-containing film-forming composition according to claim 11, wherein the thermosetting metal oxide-containing film-forming composition further comprises a monovalent or divalent or higher alcohol having a cyclic ether as a substitutional group.

14. A substrate comprising, at least:
an organic film formed on the processing substrate;
a metal oxide-containing film formed from the thermosetting metal oxide-containing film-forming composition according to claim 1 on the organic film; and
a photoresist film formed on the metal oxide-containing film.

15. A substrate comprising, at least:
an organic film formed on the processing substrate;
a metal oxide-containing film formed from the thermosetting metal oxide-containing film-forming composition according to claim 13 on the organic film; and
a photoresist film formed on the metal oxide-containing film.

16. The substrate according to claim 14, wherein an organic antireflective film is formed between the metal oxide-containing film and the photoresist film.

17. The substrate according to claim 15, wherein an organic antireflective film is formed between the metal oxide-containing film and the photoresist film.

18. The substrate according to claim 14, wherein the organic film has an aromatic skeleton.

19. The substrate according to claim 17, wherein the organic film has an aromatic skeleton.

20. The substrate according to claim 14, wherein the photoresist film is formed using a chemically amplified resist composition.

21. The substrate according to claim 19, wherein the photoresist film is formed using a chemically amplified resist composition.

22. A patterning process for forming a pattern on a substrate by lithography, comprising the steps of:
forming a metal oxide-containing film formed from the thermosetting metal oxide-containing film-forming composition according to claim 1 on an organic film formed on the processing substrate;
forming a photoresist film on the metal oxide-containing film;
subsequently conducting exposure of a pattern circuit region of the photoresist film, developing it by a developer to form a resist film pattern in the photoresist film, and dry etching the metal oxide-containing film by using the thus obtained resist film pattern as an etching mask;
etching the organic film by using the thus obtained metal oxide-containing film pattern as an etching mask; and
etching the substrate by using the thus patterned organic film as an etching mask, to form a pattern on the substrate.

23. A patterning process for forming a pattern on a substrate by lithography, comprising the steps of:
forming a metal oxide-containing film formed from the thermosetting metal oxide-containing film-forming composition according to claim 13 on an organic film formed on the processing substrate;
forming a photoresist film on the metal oxide-containing film;
subsequently conducting exposure of a pattern circuit region of the photoresist film, developing it by a developer to form a resist film pattern in the photoresist film, and dry etching the metal oxide-containing film by using the thus obtained resist film pattern as an etching mask;
etching the organic film by using the thus obtained metal oxide-containing film pattern as an etching mask; and
etching the substrate by using the thus patterned organic film as an etching mask, to form a pattern on the substrate.

24. A patterning process for forming a pattern on a substrate by lithography, comprising the steps of:
forming a metal oxide-containing film formed from the thermosetting metal oxide-containing film-forming composition according to claim 1 on an organic film formed on the processing substrate;
forming an organic antireflective film on the metal oxide-containing film;
forming a photoresist film on the organic antireflective film;
subsequently conducting exposure of a pattern circuit region of the photoresist film, developing it by a developer to form a resist film pattern in the photoresist film, and dry etching the organic antireflective film and the metal oxide-containing film by using the thus obtained resist film pattern as an etching mask;
etching the organic film by using the thus obtained metal oxide-containing film pattern as an etching mask; and
etching the substrate by using the thus patterned organic film as an etching mask, to form a pattern on the substrate.

25. A patterning process for forming a pattern on a substrate by lithography, comprising the steps of:
forming a metal oxide-containing film formed from the thermosetting metal oxide-containing film-forming composition according to claim 13 on an organic film formed on the processing substrate;
forming an organic antireflective film on the metal oxide-containing film;
forming a photoresist film on the organic antireflective film;
subsequently conducting exposure of a pattern circuit region of the photoresist film, developing it by a developer to form a resist film pattern in the photoresist film, and dry etching the organic antireflective film and the metal oxide-containing film by using the thus obtained resist film pattern as an etching mask;
etching the organic film by using the thus obtained metal oxide-containing film pattern as an etching mask; and etching the substrate by using the thus patterned organic film as an etching mask, to form a pattern on the substrate.

26. The patterning process according to claim 22, wherein the lithography is conducted by using light having a wavelength of 300 nm or shorter.

27. The patterning process according to claim 25, wherein the lithography is conducted by using light having a wavelength of 300 nm or shorter.

* * * * *